(12) United States Patent
Coban et al.

(10) Patent No.: US 11,451,840 B2
(45) Date of Patent: Sep. 20, 2022

(54) TRELLIS CODED QUANTIZATION COEFFICIENT CODING

(71) Applicant: QUALCOMM Incorporated, San Diego, CA (US)

(72) Inventors: Muhammed Zeyd Coban, Carlsbad, CA (US); Marta Karczewicz, San Diego, CA (US); Jie Dong, Sunnyvale, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/416,815

(22) Filed: May 20, 2019

(65) Prior Publication Data

US 2019/0387259 A1 Dec. 19, 2019

Related U.S. Application Data

(60) Provisional application No. 62/689,649, filed on Jun. 25, 2018, provisional application No. 62/686,580, filed on Jun. 18, 2018.

(51) Int. Cl.
*H04N 21/2383* (2011.01)
*H04L 1/00* (2006.01)
*H03M 13/25* (2006.01)

(52) U.S. Cl.
CPC ...... *H04N 21/2383* (2013.01); *H03M 13/256* (2013.01); *H04L 1/006* (2013.01); *H04L 1/0063* (2013.01)

(58) Field of Classification Search
CPC .... H03M 13/256; H04L 1/006; H04L 1/0063; H04N 19/124; H04N 19/147;
(Continued)

(56) References Cited

U.S. PATENT DOCUMENTS 4,884,272 A * 11/1989 McConnell ....... H03M 13/3955
714/792
5,048,054 A * 9/1991 Eyuboglu ............... H04L 1/206
375/222
(Continued)

OTHER PUBLICATIONS

Sayood; Introduction to Data Compression; 2006; Morgan Kaufmann Publisher; 3rd Edition; Chapter 10; p. 53.*
(Continued)

*Primary Examiner* — Peter D Le
(74) *Attorney, Agent, or Firm* — Shumaker & Sieffert, P.A.

(57) ABSTRACT

An example device includes processing circuitry configured to determine a first state of a data structure, the first state representing a first quantizer applied to a previously quantized or inverse quantized value of a previous transform coefficient of residual data for a block of the video data and update the data structure to a second state according to the first state and a parity of a partial set of syntax elements representing a partial set of a plurality of coefficient levels for the previous transform coefficient. The processing circuitry is further configured to determine a second quantizer to be used to quantize or inverse quantize a current value of a current transform coefficient according to the second state of the data structure and quantize or inverse quantize the current value of the current transform coefficient using the second quantizer.

27 Claims, 13 Drawing Sheets

(58) Field of Classification Search
CPC ...... H04N 19/18; H04N 19/184; H04N 19/34; H04N 19/70; H04N 19/91; H04N 21/2383
See application file for complete search history.

(56) References Cited

U.S. PATENT DOCUMENTS

| | | | | |
|---|---|---|---|---|
| 6,125,149 A * | 9/2000 | Jafarkhani | ........... | H04N 19/126 375/262 |
| 6,128,346 A * | 10/2000 | Suarez | ........... | H04N 19/63 341/143 |
| 6,167,162 A * | 12/2000 | Jacquin | ........... | G06T 9/004 375/240.18 |
| 6,192,158 B1 * | 2/2001 | Abousleman | ........... | H04L 27/0004 375/265 |
| 6,324,213 B1 * | 11/2001 | Harrison | ........... | B61L 25/021 341/102 |
| 6,359,935 B1 * | 3/2002 | Hui | ........... | H04L 1/005 375/262 |
| 6,535,647 B1 * | 3/2003 | Abousleman | ........... | G01J 3/2823 382/240 |
| 6,539,122 B1 * | 3/2003 | Abousleman | ........... | G06T 9/007 348/155 |
| 6,697,434 B1 * | 2/2004 | Kim | ........... | H04N 19/176 375/245 |
| 6,717,990 B1 * | 4/2004 | Abousleman | ........... | H03M 7/30 341/200 |
| 7,003,171 B1 * | 2/2006 | Takeo | ........... | H04N 19/63 375/E7.047 |
| 9,277,242 B2 * | 3/2016 | Kim | ........... | H04N 19/70 |
| 9,491,463 B2 * | 11/2016 | Sole Rojals | ........... | H04N 19/70 |
| 2003/0028845 A1 * | 2/2003 | Plante | ........... | G06F 17/10 714/796 |
| 2004/0230429 A1 * | 11/2004 | Son | ........... | G10L 19/0212 704/230 |
| 2006/0269012 A1 * | 11/2006 | Kim | ........... | G01S 5/06 375/270 |
| 2007/0217522 A1 * | 9/2007 | Sun | ........... | H03M 13/31 375/242 |
| 2009/0167588 A1 * | 7/2009 | Sung | ........... | H03M 7/3082 341/200 |
| 2009/0257489 A1 * | 10/2009 | Karczewicz | ........... | H04N 19/124 375/240.03 |
| 2012/0163471 A1 * | 6/2012 | Karczewicz | ........... | H04N 19/13 375/240.23 |
| 2013/0188699 A1 * | 7/2013 | Joshi | ........... | H04N 19/18 375/240.12 |
| 2013/0272414 A1 * | 10/2013 | Sole Rojals | ........... | H04N 19/14 375/240.16 |
| 2014/0307800 A1 * | 10/2014 | Sole Rojals | ........... | H04N 19/91 375/240.18 |
| 2015/0172650 A1 * | 6/2015 | Koo | ........... | H04N 19/42 375/240.03 |
| 2017/0154632 A1 * | 6/2017 | Sung | ........... | G10L 19/038 |

OTHER PUBLICATIONS

Gersho et al.; Vector Quantization and Signal Compression; 1992; Springer; Chapter 15; p. 33.*
Albrecht et al.; Description of SDR, HDR, and 360 degere video coding technology proposal by Fraunhofer HHI; Apr. 2018, v4; ISO/IEC; pp. 1-122.*
Albrecht M., et al., "Description of SDR, HDR and 360° Video Coding Technology proposal by Fraunhofer HHI", 10th JVET Meeting; Apr. 10, 2018-Apr. 20, 2018; San Diego; (The Joint Video Exploration Team of ISO/IEC JTC1/SC29/WG11 and ITU-T SG.16); URL:http://phenix.int-evry.fr/jvet/,,No. JVET-J0014-v4,Apr. 12, 2018, XP030151173, 122 pages.
Bilgin A., et al., "Progressive Image Coding Using Trellis Coded Quantization", IEEE Transactions on Image Processing, IEEE Service Center, Piscataway, NJ, US, Nov. 1, 1999, vol. 8, No. 11, XP011026407, ISSN: 1057-7149, abstract, sections III and IV, pp. 1638-1643.
Chen J., et al., "Algorithm Description of Joint Exploration Test Model 1," Joint Video Exploration Team (JVET) of ITU-T SG16 WP3 and ISO/IEC JTC1/SC29/WG11, 1nd Meeting: Geneva, CH, Oct. 19-21, 2015, JVET-A1001, 27 pp.
Chen J., et al., "Algorithm Description of Joint Exploration Test Model 7 (JEM 7)," 7th Meeting; Joint Collaborative Team on Video Coding (JCT-VC) of ITU-T SG 16 WP 3 and ISO/IEC JTC 1/SC 29/WG 11, No. JVET-G1001v1, Jul. 13-21, 2017, 50 pp.
Coban M., (Qualcomm)., et al., "Non-CE7: Entropy Coding for Dependent Quantization", 11th JVET Meeting; Jul. 11, 2018-Jul. 18, 2018; Ljubljana; (The Joint Video Exploration Team of ISO/IEC JTC1/SC29/WG11 and ITU-T SG.16),No. JVET-K0070, Jul. 17, 2018, XP030199982, Retrieved from the Internet: URL:http://phenix.int-evry.fr/ivet/doc_end_user/documents/11_Ljubljana/wg11/JVET-K0070-v4.zip JVET-K0070-v4.docx [retrieved on Jul. 17, 2018], 6 pages.
Dong J., (Qualcomm) et al., "CE7-Related: TCQ with High Throughput Coefficient Coding", 11th JVET Meeting; Jul. 11, 2018-Jul. 18, 2018; Ljubljana; (The Joint Video Exploration Team of ISO/IEC JTC1/SC29/WG11 and ITU-T SG.16 ),No. JVET-K0319, Jul. 15, 2018, XP030199860, Retrieved from the Internet: URL:http://phenix.int-evry.fr/ivet/doc_end_user/documents/11_Ljubljana/wg11/JVET-K0319-v4.zip JVET-K0319-v4.docx [retrieved on Jul. 15, 2018], 5 pages.
Ergen S., "ZigBee/IEEE 802.15.4 Summary", Sep. 10, 2004, 37 pp.
IEEE Std 802.11ad-2012: "Part 11: Wireless LAN Medium Access Control (MAC) and Physical Layer (PHY) Specifications—Amendment 3: Enhancements for Very High Throughput in the 60 GHz Band", LAN/MAN Standards Committee of the IEEE Computer Society, Dec. 28, 2012, 628 Pages.
International Search Report and Written Opinion—PCT/US2019/033344—ISA/EPO—dated Aug. 19, 2019.
ITU-T H.223, Series H: Audiovisual and Multimedia Systems, Infrastructure of Audiovisual Services—Transmission Multiplexing and Synchronization, Multiplexing Protocol for Low Bit Rate Multimedia Communication, The International Telecommunication Union, Jul. 2001, 74 pp.
ITU-T H.261, Line Transmission of Non-Telephone Signals, Video Codec for Audiovisual Services at p x 64 kbits, The International Telecommunication Union, Mar. 1993, 29 pp.
ITU-T H.262 (Feb. 2000), "Information Technology—Generic Coding of Moving Pictures and Associated Audio Information: Video", Series H: Audiovisual and Multimedia Systems, Infrastructure of Audiovisual Services—Coding of Moving Video, Feb. 2000, 220 pages.
ITU-T H.263, Series H: Audiovisual and Multimedia Systems, Infrastructure of audiovisual services—Coding of moving video. Video coding for low bit rate communication, The International Telecommunication Union. Jan. 2005, 226 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
ITU-T H.265, Series H: Audiovisual and Multimedia Systems, Infrastructure of audiovisual services—Coding of moving video. Advanced video coding for generic audiovisual services, The International Telecommunication Union. Dec. 2016, 664 pp.
Schwarz H., et al., "Description of Core Experiment 7 (CE7): Quantization and Coefficient coding", 10. JVET Meeting; Apr. 10, 2018-Apr. 20, 2018; San Diego; (The Joint Video Exploration Team of ISO/IEC JTC1/SC29/WG11 and ITU-T SG.16 ); URL:http://phenix.int-evry.fr/jvet/,, No. JVET-J1027-V4, May 18, 2018 (May 18, 2018), pp. 1-18, XP030151325, Section 6.
Sole J., et al., "Transform Coefficient Coding in HEVC", IEEE Transactions on Circuits and Systems for Video Technology, IEEE Service Center, Piscataway, NJ, US, vol. 22, No. 12, Dec. 1, 2012 (Dec. 1, 2012), pp. 1765-1777, XP011487805, ISSN: 1051-8215, DOI: 10.1109/TCSVT.2012.2223055.
Schwarz H., et al., "CE7: Transform Coefficient Coding with Reduced Number of Regular-coded Bins (tests 7.1.3a, 7.1.3b)",

(56) References Cited

OTHER PUBLICATIONS

Joint Video Experts Team (JVET) Joint Video Experts Team (JVET), JVET-L0274-v3, 12th Meeting: Macao, CN, Oct. 3-12, 2018, 19 pages.
Bross (Fraunhofer) B., et al., "WD4: Working Draft 4 of High-Efficiency Video Coding", 6. JCT-VC Meeting, Jul. 14, 2011-Jul. 22, 2011, Torino, (Joint Collaborative Team on Video Coding of ISO/IEC JTC1/SC29/WG11 and ITU-T SG.16), No. JCTVC-F803_d1, Sep. 8, 2011 (Sep. 8, 2011), XP030229343, 222 Pages.
ITU-T Standard H.266, Series H: Audiovisual and Multimedia Systems, Infrastructure of Audiovisual Services—Coding of Moving Video, Versatile Video Coding, International Telecommunication Union, Geneva, CH, No. H.266 (Aug. 2020), Aug. 29, 2020 (Aug. 29, 2020), XP044296169, 513 pages.

\* cited by examiner

TRELLIS CODED QUANTIZATION COEFFICIENT CODING

This application claims the benefit of U.S. Provisional Application No. 62/689,649, filed Jun. 25, 2018 and U.S. Provisional Application No. 62/686,580, filed Jun. 18, 2018, each of which is hereby incorporated by reference in its entirety.

TECHNICAL FIELD

This disclosure relates to video coding, including video encoding and video decoding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video coding techniques, such as those described in the standards defined by ITU-T H.261, ISO/IEC MPEG-1 Visual, ITU-T H.262 or ISO/IEC MPEG-2 Visual, ISO/IEC MPEG-4 Visual, ITU-T H.263, ITU-T H.264/MPEG-4 Part 10, Advanced Video Coding (AVC) (also known as ISO/IEC MPEG-4 AVC), including its Scalable Video Coding (SVC) and Multiview Video Coding (MVC) extensions, the High Efficiency Video Coding (HEVC) standard, ITU-T H.265/High Efficiency Video Coding (HEVC), and extensions of such standards. The video devices may transmit, receive, encode, decode, and/or store digital video information more efficiently by implementing such video coding techniques.

Video coding techniques include spatial (intra-picture) prediction and/or temporal (inter-picture) prediction to reduce or remove redundancy inherent in video sequences. For block-based video coding, a video slice (e.g., a video picture or a portion of a video picture) may be partitioned into video blocks, which may also be referred to as coding tree units (CTUs), coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

SUMMARY

In general, this disclosure describes techniques for performing a trellis coded quantization scheme that is compatible with a bitplane by bitplane coefficient coding schemes and/or for performing a trellis coded quantization scheme driven by a significance map in a video coding process.

In one example, the disclosure describes a method of quantizing or inverse quantizing for processing video data, the method including: determining a first state of a data structure, the first state representing a first quantizer applied to a previously quantized or inverse quantized value of a previous transform coefficient of residual data for a block of the video data; updating the data structure to a second state according to the first state and a parity of a partial set of syntax elements representing a partial set of a plurality of coefficient levels for the previous transform coefficient; determining a second quantizer to be used to quantize or inverse quantize a current value of a current transform coefficient according to the second state of the data structure; and quantizing or inverse quantizing the current value of the current transform coefficient using the second quantizer.

In one example, the disclosure describes a device for quantizing or inverse quantizing for processing video data, the device including processing circuitry configured to: determine a first state of a data structure, the first state representing a first quantizer applied to a previously quantized or inverse quantized value of a previous transform coefficient of residual data for a block of the video data; update the data structure to a second state according to the first state and a parity of a partial set of syntax elements representing a partial set of a plurality of coefficient levels for the previous transform coefficient of the residual data; determine a second quantizer to be used to quantize or inverse quantize a current value of a current transform coefficient according to the second state of the data structure; and quantize or inverse quantize the current value of the current transform coefficient using the second quantizer.

In one example, the disclosure describes a device for quantizing or inverse quantizing for processing video data, the device including: means determining a first state of a data structure, the first state representing a first quantizer applied to a previously quantized or inverse quantized value of a previous transform coefficient of residual data for a block of the video data; means for updating the data structure to a second state according to the first state and a parity of a partial set of syntax elements representing a partial set of a plurality of coefficient levels for the previous transform coefficient of the residual data; means for determining a second quantizer to be used to quantize or inverse quantize a current value of a current transform coefficient according to the second state of the data structure; and means for quantizing or inverse quantizing the current value of the current transform coefficient using the second quantizer.

In one example, the disclosure describes a computer-readable storage medium including instructions stored thereon that when executed cause one or more processors to: determine a first state of a data structure, the first state representing a first quantizer applied to a previously quantized or inverse quantized value of a previous transform coefficient of residual data for a block of the video data; update the data structure to a second state according to the first state and a parity of a partial set of syntax elements representing a partial set of a plurality of coefficient levels for the previous transform coefficient of the residual data; determine a second quantizer to be used to quantize or inverse quantize a current value of a current transform coefficient according to the second state of the data structure; and quantize or inverse quantize the current value of the current transform coefficient using the second quantizer.

In one example, the disclosure describes a method of coding video data, the method including: determining a first state of a data structure, the first state representing a previous context used to code a previous value of a syntax element for a previous transform coefficient of residual data for a block of video data; updating the data structure to a second state according to the first state and whether the previous transform coefficient had an absolute value greater than a threshold; determining a current context to be used to code a current value of the syntax element for a current transform coefficient according to the second state of the data structure; and coding the current value of the syntax element using the current context.

In one example, the disclosure describes a device comprising processing circuitry configured to: determine a first state of a data structure, the first state representing a previous context used to code a previous value of a syntax element for a previous transform coefficient of residual data for a block of video data; update the data structure to a second state according to the first state and whether the previous transform coefficient had an absolute value greater than a threshold; determine a current context to be used to code a current value of the syntax element for a current transform coefficient according to the second state of the data structure; and code the current value of the syntax element using the current context.

In one example, the disclosure describes a device comprising means for determining a first state of a data structure, the first state representing a previous context used to code a previous value of a syntax element for a previous transform coefficient of residual data for a block of video data; means for updating the data structure to a second state according to the first state and whether the previous transform coefficient had an absolute value greater than a threshold; means for determining a current context to be used to code a current value of the syntax element for a current transform coefficient according to the second state of the data structure; and means for coding the current value of the syntax element using the current context.

In one example, the disclosure describes a computer-readable storage medium including instructions stored thereon that when executed cause one or more processors to: determine a first state of a data structure, the first state representing a previous context used to code a previous value of a syntax element for a previous transform coefficient of residual data for a block of video data; update the data structure to a second state according to the first state and whether the previous transform coefficient had an absolute value greater than a threshold; determine a current context to be used to code a current value of the syntax element for a current transform coefficient according to the second state of the data structure; and code the current value of the syntax element using the current context.

The details of one or more examples are set forth in the accompanying drawings and the description below. Other features, objects, and advantages will be apparent from the description and drawings, and from the claims.

DETAILED DESCRIPTION

Figure 1:
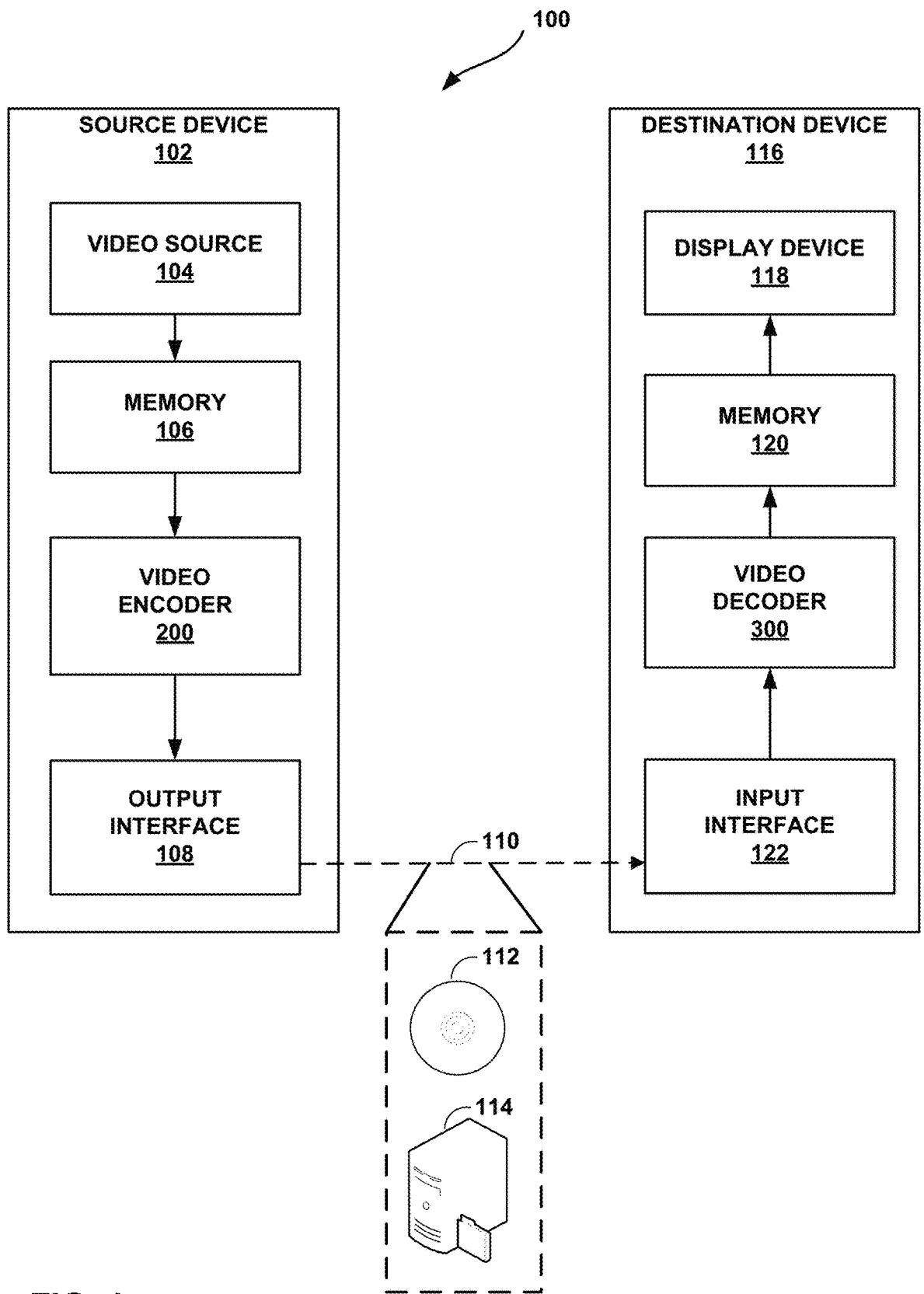
FIG. 1 is a block diagram illustrating an example video encoding and decoding system that may perform the techniques of this disclosure.

FIG. 1 is a block diagram illustrating an example video encoding and decoding system 100 that may perform the techniques of this disclosure. The techniques of this disclosure are generally directed to coding (encoding and/or decoding) video data. In general, video data includes any data for processing a video. Thus, video data may include raw, uncoded video, encoded video, decoded (e.g., reconstructed) video, and video metadata, such as signaling data.

As shown in FIG. 1, system 100 includes a source device 102 that provides encoded video data to be decoded and displayed by a destination device 116, in this example. In particular, source device 102 provides the video data to destination device 116 via a computer-readable medium 110. Source device 102 and destination device 116 may comprise any of a wide range of devices, including desktop computers, notebook (i.e., laptop) computers, tablet computers, set-top boxes, telephone handsets such smartphones, televisions, cameras, display devices, digital media players, video gaming consoles, video streaming device, or the like. In some cases, source device 102 and destination device 116 may be equipped for wireless communication, and thus may be referred to as wireless communication devices.

In the example of FIG. 1, source device 102 includes video source 104, memory 106, video encoder 200, and output interface 108. Destination device 116 includes input interface 122, video decoder 300, memory 120, and display device 118. In accordance with this disclosure, video encoder 200 of source device 102 and video decoder 300 of destination device 116 may be configured to apply the techniques for performing trellis coded quantization coefficient coding using a significance map. Thus, source device 102 represents an example of a video encoding device, while destination device 116 represents an example of a video decoding device. In other examples, a source device and a destination device may include other components or arrangements. For example, source device 102 may receive video data from an external video source, such as an external camera. Likewise, destination device 116 may interface with an external display device, rather than including an integrated display device.

System 100 as shown in FIG. 1 is merely one example. In general, any digital video encoding and/or decoding device may perform techniques for performing trellis coded quantization coefficient coding using a significance map. Source device 102 and destination device 116 are merely examples of such coding devices in which source device 102 generates coded video data for transmission to destination device 116. This disclosure refers to a "coding" device as a device that performs coding (encoding and/or decoding) of data. Thus, video encoder 200 and video decoder 300 represent examples of coding devices, in particular, a video encoder and a video decoder, respectively. In some examples, devices 102, 116 may operate in a substantially symmetrical manner such that each of devices 102, 116 include video encoding and decoding components. Hence, system 100 may support one-way or two-way video transmission between devices 102, 116, e.g., for video streaming, video playback, video broadcasting, or video telephony.

In general, video source 104 represents a source of video data (i.e., raw, uncoded video data) and provides a sequential series of pictures (also referred to as "frames") of the video data to video encoder 200, which encodes data for the pictures. Video source 104 of source device 102 may include a video capture device, such as a video camera, a video archive containing previously captured raw video, and/or a video feed interface to receive video from a video content provider. As a further alternative, video source 104 may generate computer graphics-based data as the source video, or a combination of live video, archived video, and computer-generated video. In each case, video encoder 200 encodes the captured, pre-captured, or computer-generated video data. Video encoder 200 may rearrange the pictures from the received order (sometimes referred to as "display order") into a coding order for coding. Video encoder 200 may generate a bitstream including encoded video data. Source device 102 may then output the encoded video data via output interface 108 onto computer-readable medium 110 for reception and/or retrieval by, e.g., input interface 122 of destination device 116.

Memory 106 of source device 102 and memory 120 of destination device 116 represent general purpose memories. In some example, memories 106, 120 may store raw video data, e.g., raw video from video source 104 and raw, decoded video data from video decoder 300. Additionally, or alternatively, memories 106, 120 may store software instructions executable by, e.g., video encoder 200 and video decoder 300, respectively. Although shown separately from video encoder 200 and video decoder 300 in this example, it should be understood that video encoder 200 and video decoder 300 may also include internal memories for functionally similar or equivalent purposes. Furthermore, memories 106, 120 may store encoded video data, e.g., output from video encoder 200 and input to video decoder 300. In some examples, portions of memories 106, 120 may be allocated as one or more video buffers, e.g., to store raw, decoded, and/or encoded video data.

Computer-readable medium 110 may represent any type of medium or device capable of transporting the encoded video data from source device 102 to destination device 116. In one example, computer-readable medium 110 represents a communication medium to enable source device 102 to transmit encoded video data directly to destination device 116 in real-time, e.g., via a radio frequency network or computer-based network. Output interface 108 may modulate a transmission signal including the encoded video data, and input interface 122 may modulate the received transmission signal, according to a communication standard, such as a wireless communication protocol. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 102 to destination device 116.

In some examples, source device 102 may output encoded data from output interface 108 to storage device 102. Similarly, destination device 116 may access encoded data from storage device 102 via input interface 122. Storage device 116 may include any of a variety of distributed or locally accessed data storage media such as a hard drive, Blu-ray discs, DVDs, CD-ROMs, flash memory, volatile or non-volatile memory, or any other suitable digital storage media for storing encoded video data.

In some examples, source device 102 may output encoded video data to file server 114 or another intermediate storage device that may store the encoded video generated by source device 102. Destination device 116 may access stored video data from file server 114 via streaming or download. File server 114 may be any type of server device capable of storing encoded video data and transmitting that encoded video data to the destination device 116. File server 114 may represent a web server (e.g., for a website), a File Transfer Protocol (FTP) server, a content delivery network device, or a network attached storage (NAS) device. Destination device 116 may access encoded video data from file server 114 through any standard data connection, including an Internet connection. This may include a wireless channel (e.g., a Wi-Fi connection), a wired connection (e.g., DSL, cable modem, etc.), or a combination of both that is suitable for accessing encoded video data stored on file server 114. File server 114 and input interface 122 may be configured to operate according to a streaming transmission protocol, a download transmission protocol, or a combination thereof.

Output interface 108 and input interface 122 may represent wireless transmitters/receiver, modems, wired networking components (e.g., Ethernet cards), wireless communication components that operate according to any of a variety of IEEE 802.11 standards, or other physical components. In examples where output interface 108 and input interface 122 comprise wireless components, output interface 108 and input interface 122 may be configured to transfer data, such as encoded video data, according to a cellular communication standard, such as 4G, 4G-LTE (Long-Term Evolution), LTE Advanced, 5G, or the like. In some examples where output interface 108 comprises a wireless transmitter, output interface 108 and input interface 122 may be configured to transfer data, such as encoded video data, according to other wireless standards, such as an IEEE 802.11 specification, an IEEE 802.15 specification (e.g., ZigBee™), a Bluetooth™ standard, or the like. In some examples, source device 102 and/or destination device 116 may include respective system-on-a-chip (SoC) devices. For example, source device 102 may include an SoC device to perform the functionality attributed to video encoder 200 and/or output interface 108, and destination device 116 may include an SoC device to perform the functionality attributed to video decoder 300 and/or input interface 122.

The techniques of this disclosure may be applied to video coding in support of any of a variety of multimedia applications, such as over-the-air television broadcasts, cable television transmissions, satellite television transmissions, Internet streaming video transmissions, such as dynamic adaptive streaming over HTTP (DASH), digital video that is encoded onto a data storage medium, decoding of digital video stored on a data storage medium, or other applications.

Input interface 122 of destination device 116 receives an encoded video bitstream from computer-readable medium 110 (e.g., storage device 112, file server 114, or the like). The encoded video bitstream computer-readable medium 110 may include signaling information defined by video encoder 200, which is also used by video decoder 300, such as syntax elements having values that describe characteristics and/or processing of video blocks or other coded units (e.g., slices, pictures, groups of pictures, sequences, or the like). Display device 118 displays decoded pictures of the decoded video data to a user. Display device 118 may represent any of a variety of display devices such as a cathode ray tube (CRT), a liquid crystal display (LCD), a plasma display, an organic light emitting diode (OLED) display, or another type of display device.

Although not shown in FIG. 1, in some examples, video encoder 200 and video decoder 300 may each be integrated with an audio encoder and/or audio decoder, and may include appropriate MUX-DEMUX units, or other hardware and/or software, to handle multiplexed streams including both audio and video in a common data stream. If applicable, MUX-DEMUX units may conform to the ITU H.223 multiplexer protocol, or other protocols such as the user datagram protocol (UDP).

Video encoder 200 and video decoder 300 each may be implemented as any of a variety of suitable encoder and/or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 200 and video decoder 300 may be included in one or more encoders or decoders, either of which may be integrated as part of a combined encoder/decoder (CODEC) in a respective device. A device including video encoder 200 and/or video decoder 300 may comprise an integrated circuit, a microprocessor, and/or a wireless communication device, such as a cellular telephone.

Video encoder 200 and video decoder 300 may operate according to a video coding standard, such as ITU-T H.265, also referred to as High Efficiency Video Coding (HEVC) or extensions thereto, such as the multi-view and/or scalable video coding extensions. Alternatively, video encoder 200 and video decoder 300 may operate according to other proprietary or industry standards, such as the Joint Exploration Test Model (JEM). The techniques of this disclosure, however, are not limited to any particular coding standard.

In general, video encoder 200 and video decoder 300 may perform block-based coding of pictures. The term "block" generally refers to a structure including data to be processed (e.g., encoded, decoded, or otherwise used in the encoding and/or decoding process). For example, a block may include a two-dimensional matrix of samples of luminance and/or chrominance data. In general, video encoder 200 and video decoder 300 may code video data represented in a YUV (e.g., Y, Cb, Cr) format. That is, rather than coding red, green, and blue (RGB) data for samples of a picture, video encoder 200 and video decoder 300 may code luminance and chrominance components, where the chrominance components may include both red hue and blue hue chrominance components. In some examples, video encoder 200 converts received RGB formatted data to a YUV representation prior to encoding, and video decoder 300 converts the YUV representation to the RGB format. Alternatively, pre- and post-processing units (not shown) may perform these conversions.

This disclosure may generally refer to coding (e.g., encoding and decoding) of pictures to include the process of encoding or decoding data of the picture. Similarly, this disclosure may refer to coding of blocks of a picture to include the process of encoding or decoding data for the blocks, e.g., prediction and/or residual coding. An encoded video bitstream generally includes a series of values for syntax elements representative of coding decisions (e.g., coding modes) and partitioning of pictures into blocks. Thus, references to coding a picture or a block should generally be understood as coding values for syntax elements forming the picture or block.

HEVC defines various blocks, including coding units (CUs), prediction units (PUs), and transform units (TUs). According to HEVC, a video coder (such as video encoder 200) partitions a coding tree unit (CTU) into CUs according to a quadtree structure. That is, the video coder partitions CTUs and CUs into four equal, non-overlapping squares, and each node of the quadtree has either zero or four child nodes. Nodes without child nodes may be referred to as "leaf nodes," and CUs of such leaf nodes may include one or more PUs and/or one or more TUs. The video coder may further partition PUs and TUs. For example, in HEVC, a residual quadtree (RQT) represents partitioning of TUs. In HEVC, PUs represent inter-prediction data, while TUs represent residual data. CUs that are intra-predicted include intra-prediction information, such as an intra-mode indication.

As another example, video encoder 200 and video decoder 300 may be configured to operate according to JEM. According to JEM, a video coder (such as video encoder 200) partitions a picture into a plurality of coding tree units (CTUs). Video encoder 200 may partition a CTU according to a tree structure, such as a quadtree-binary tree (QTBT) structure. The QTBT structure of JEM removes the concepts of multiple partition types, such as the separation between CUs, PUs, and TUs of HEVC. A QTBT structure of JEM includes two levels: a first level partitioned according to quadtree partitioning, and a second level partitioned according to binary tree partitioning. A root node of the QTBT structure corresponds to a CTU. Leaf nodes of the binary trees correspond to coding units (CUs).

In some examples, video encoder 200 and video decoder 300 may use a single QTBT structure to represent each of the luminance and chrominance components, while in other examples, video encoder 200 and video decoder 300 may use two or more QTBT structures, such as one QTBT structure for the luminance component and another QTBT structure for both chrominance components (or two QTBT structures for respective chrominance components).

Video encoder 200 and video decoder 300 may be configured to use quadtree partitioning per HEVC, QTBT partitioning according to JEM, or other partitioning structures. For purposes of explanation, the description of the techniques of this disclosure is presented with respect to QTBT partitioning. However, the techniques of this disclosure may also be applied to video coders configured to use quadtree partitioning, or other types of partitioning as well.

This disclosure may use "N×N" and "N by N" interchangeably to refer to the sample dimensions of a block (such as a CU or other video block) in terms of vertical and horizontal dimensions, e.g., 16×16 samples or 16 by 16 samples. In general, a 16×16 CU will have 16 samples in a vertical direction (y=16) and 16 samples in a horizontal direction (x=16). Likewise, an N×N CU generally has N samples in a vertical direction and N samples in a horizontal direction, where N represents a nonnegative integer value. The samples in a CU may be arranged in rows and columns. Moreover, CUs need not necessarily have the same number of samples in the horizontal direction as in the vertical direction. For example, CUs may comprise N×M samples, where M is not necessarily equal to N.

Video encoder 200 encodes video data for CUs representing prediction and/or residual information, and other information. The prediction information indicates how the CU is to be predicted in order to form a prediction block for the CU. The residual information generally represents sample-by-sample differences between samples of the CU prior to encoding and the prediction block.

To predict a CU, video encoder 200 may generally form a prediction block for the CU through inter-prediction or intra-prediction. Inter-prediction generally refers to predicting the CU from data of a previously coded picture, whereas intra-prediction generally refers to predicting the CU from previously coded data of the same picture. To perform inter-prediction, video encoder 200 may generate the prediction block using one or more motion vectors. Video encoder 200 may generally perform a motion search to identify a reference block that closely matches the CU, e.g., in terms of differences between the CU and the reference block. Video encoder 200 may calculate a difference metric using a sum of absolute difference (SAD), sum of squared differences (SSD), mean absolute difference (MAD), mean squared differences (MSD), or other such difference calculations to determine whether a reference block closely matches the current CU. In some examples, video encoder 200 may predict the current CU using uni-directional prediction or bi-directional prediction.

JEM also provides an affine motion compensation mode, which may be considered an inter-prediction mode. In affine motion compensation mode, video encoder 200 may determine two or more motion vectors that represent non-translational motion, such as zoom in or out, rotation, perspective motion, or other irregular motion types.

To perform intra-prediction, video encoder 200 may select an intra-prediction mode to generate the prediction block. JEM provides sixty-seven intra-prediction modes, including various directional modes, as well as planar mode and DC mode. In general, video encoder 200 selects an intra-prediction mode that describes neighboring samples to a current block (e.g., a block of a CU) from which to predict samples of the current block. Such samples may generally be above, above and to the left, or to the left of the current block in the same picture as the current block, assuming video encoder 200 codes CTUs and CUs in raster scan order (left to right, top to bottom).

Video encoder 200 encodes data representing the prediction mode for a current block. For example, for inter-prediction modes, video encoder 200 may encode data representing which of the various available inter-prediction modes is used, as well as motion information for the corresponding mode. For uni-directional or bi-directional inter-prediction, for example, video encoder 200 may encode motion vectors using advanced motion vector prediction (AMVP) or merge mode. Video encoder 200 may use similar modes to encode motion vectors for affine motion compensation mode.

Following prediction, such as intra-prediction or inter-prediction of a block, video encoder 200 may calculate residual data for the block. The residual data, such as a residual block, represents sample by sample differences between the block and a prediction block for the block, formed using the corresponding prediction mode. Video encoder 200 may apply one or more transforms to the residual block, to produce transformed data in a transform domain instead of the sample domain. For example, video encoder 200 may apply a discrete cosine transform (DCT), an integer transform, a wavelet transform, or a conceptually similar transform to residual video data. Additionally, video encoder 200 may apply a secondary transform following the first transform, such as a mode-dependent non-separable secondary transform (MDNSST), a signal dependent transform, a Karhunen-Loeve transform (KLT), or the like. Video encoder 200 produces transform coefficients following application of the one or more transforms.

As noted above, following any transforms to produce transform coefficients, video encoder 200 may perform quantization of the transform coefficients. Quantization generally refers to a process in which transform coefficients are quantized to possibly reduce the amount of data used to represent the coefficients, providing further compression. By performing the quantization process, video encoder 200 may reduce the bit depth associated with some or all of the coefficients. For example, video encoder 200 may round an n-bit value down to an m-bit value during quantization, where n is greater than m. In some examples, to perform quantization, video encoder 200 may perform a bitwise right-shift of the value to be quantized.

Following quantization, video encoder 200 may scan the transform coefficients, producing a one-dimensional vector from the two-dimensional matrix including the quantized transform coefficients. The scan may be designed to place higher energy (and therefore lower frequency) coefficients at the front of the vector and to place lower energy (and therefore higher frequency) transform coefficients at the back of the vector. In some examples, video encoder 200 may utilize a predefined scan order to scan the quantized transform coefficients to produce a serialized vector, and then entropy encode the quantized transform coefficients of the vector. In other examples, video encoder 200 may perform an adaptive scan. After scanning the quantized transform coefficients to form the one-dimensional vector, video encoder 200 may entropy encode the one-dimensional vector, e.g., according to context-adaptive binary arithmetic coding (CABAC). Video encoder 200 may also entropy encode values for syntax elements describing metadata associated with the encoded video data for use by video decoder 300 in decoding the video data.

To perform CABAC, video encoder 200 may assign a context within a context model to a symbol to be transmitted. The context may relate to, for example, whether neighboring values of the symbol are zero-valued or not. The probability determination may be based on a context assigned to the symbol.

Video encoder 200 may further generate syntax data, such as block-based syntax data, picture-based syntax data, and sequence-based syntax data, to video decoder 300, e.g., in a picture header, a block header, a slice header, or other syntax data, such as a sequence parameter set (SPS), picture parameter set (PPS), or video parameter set (VPS). Video decoder 300 may likewise decode such syntax data to determine how to decode corresponding video data.

In this manner, video encoder 200 may generate a bitstream including encoded video data, e.g., syntax elements describing partitioning of a picture into blocks (e.g., CUs) and prediction and/or residual information for the blocks. Ultimately, video decoder 300 may receive the bitstream and decode the encoded video data.

In general, video decoder 300 performs a reciprocal process to that performed by video encoder 200 to decode the encoded video data of the bitstream. For example, video decoder 300 may decode values for syntax elements of the bitstream using CABAC in a manner substantially similar to, albeit reciprocal to, the CABAC encoding process of video encoder 200. The syntax elements may define partitioning information of a picture into CTUs, and partitioning of each CTU according to a corresponding partition structure, such as a QTBT structure, to define CUs of the CTU. The syntax elements may further define prediction and residual information for blocks (e.g., CUs) of video data.

The residual information may be represented by, for example, quantized transform coefficients. Video decoder 300 may inverse quantize and inverse transform the quantized transform coefficients of a block to reproduce a residual block for the block. Video decoder 300 uses a signaled prediction mode (intra- or inter-prediction) and related prediction information (e.g., motion information for inter-prediction) to form a prediction block for the block. Video decoder 300 may then combine the prediction block and the residual block (on a sample-by-sample basis) to reproduce the original block. Video decoder 300 may perform additional processing, such as performing a deblocking process to reduce visual artifacts along boundaries of the block.

This disclosure may generally refer to "signaling" certain information, such as syntax elements. The term "signaling" may generally refer to the communication of values syntax elements and/or other data used to decode encoded video data. That is, video encoder 200 may signal values for syntax elements in the bitstream. In general, signaling refers to generating a value in the bitstream. As noted above, source device 102 may transport the bitstream to destination device 116 substantially in real time, or not in real time, such as might occur when storing syntax elements to storage device 112 for later retrieval by destination device 116.

Figure 2A:
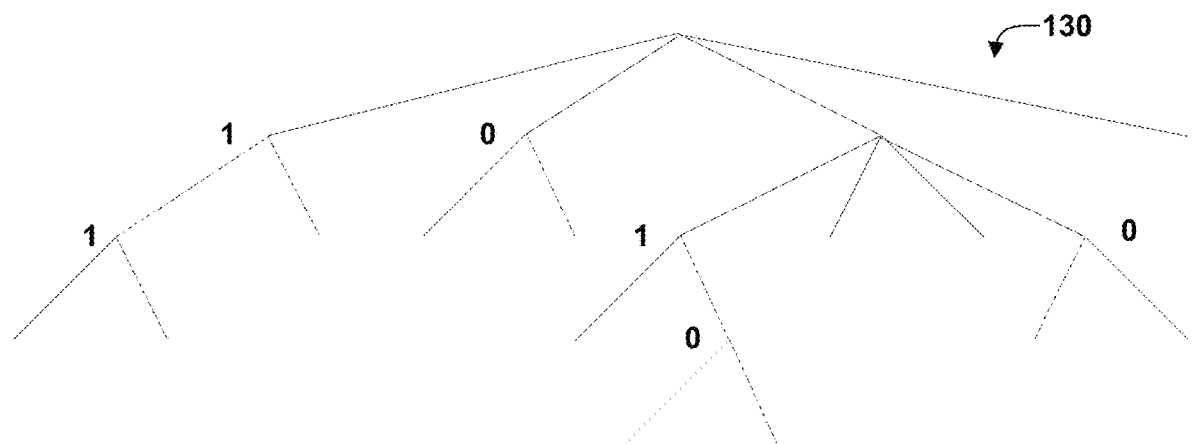
FIGS. 2A and 2B are conceptual diagrams illustrating an example quadtree binary tree (QTBT) structure, and a corresponding coding tree unit (CTU).
Figure 2B:
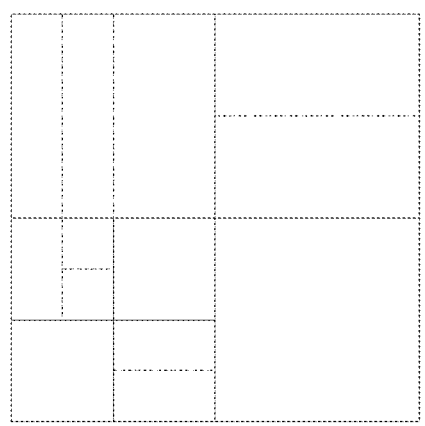

FIGS. 2A and 2B are conceptual diagram illustrating an example quadtree binary tree (QTBT) structure 130, and a corresponding coding tree unit (CTU) 132. The solid lines represent quadtree splitting, and dotted lines indicate binary tree splitting. In each split (i.e., non-leaf) node of the binary tree, one flag is signaled to indicate which splitting type (i.e., horizontal or vertical) is used, where 0 indicates horizontal splitting and 1 indicates vertical splitting in this example. For the quadtree splitting, there is no need to indicate the splitting type, since quadtree nodes split a block horizontally and vertically into 4 sub-blocks with equal size. Accordingly, video encoder 200 may encode, and video decoder 300 may decode, syntax elements (such as splitting information) for a region tree level of QTBT structure 130 (i.e., the solid lines) and syntax elements (such as splitting information) for a prediction tree level of QTBT structure 130 (i.e., the dashed lines). Video encoder 200 may encode, and video decoder 300 may decode, video data, such as prediction and transform data, for CUs represented by terminal leaf nodes of QTBT structure 130.

In general, CTU 132 of FIG. 2B may be associated with parameters defining sizes of blocks corresponding to nodes of QTBT structure 130 at the first and second levels. These parameters may include a CTU size (representing a size of CTU 132 in samples), a minimum quadtree size (MinQTSize, representing a minimum allowed quadtree leaf node size), a maximum binary tree size (MaxBTSize, representing a maximum allowed binary tree root node size), a maximum binary tree depth (MaxBTDepth, representing a maximum allowed binary tree depth), and a minimum binary tree size (MinBTSize, representing the minimum allowed binary tree leaf node size).

The root node of a QTBT structure corresponding to a CTU may have four child nodes at the first level of the QTBT structure, each of which may be partitioned according to quadtree partitioning. That is, nodes of the first level are either leaf nodes (having no child nodes) or have four child nodes. The example of QTBT structure 130 represents such nodes as including the parent node and child nodes having solid lines for branches. If nodes of the first level are not larger than the maximum allowed binary tree root node size (MaxBTSize), they can be further partitioned by respective binary trees. The binary tree splitting of one node can be iterated until the nodes resulting from the split reach the minimum allowed binary tree leaf node size (MinBTSize) or the maximum allowed binary tree depth (MaxBTDepth). The example of QTBT structure 130 represents such nodes as having dashed lines for branches. The binary tree leaf node is referred to as a coding unit (CU), which is used for prediction (e.g., intra-picture or inter-picture prediction) and transform, without any further partitioning. As discussed above, CUs may also be referred to as "video blocks" or "blocks."

In one example of the QTBT partitioning structure, the CTU size is set as 128×128 (luma samples and two corresponding 64×64 chroma samples), the MinQTSize is set as 16×16, the MaxBTSize is set as 64×64, the MinBTSize (for both width and height) is set as 4, and the MaxBTDepth is set as 4. The quadtree partitioning is applied to the CTU first to generate quad-tree leaf nodes. The quadtree leaf nodes may have a size from 16×16 (i.e., the MinQTSize) to 128×128 (i.e., the CTU size). If the leaf quadtree node is 128×128, it will not be further split by the binary tree, since the size exceeds the MaxBTSize (i.e., 64×64, in this example). Otherwise, the leaf quadtree node will be further partitioned by the binary tree. Therefore, the quadtree leaf node is also the root node for the binary tree and has the binary tree depth as 0. When the binary tree depth reaches MaxBTDepth (4, in this example), no further splitting is permitted. When the binary tree node has width equal to MinBTSize (4, in this example), it implies no further horizontal splitting is permitted. Similarly, a binary tree node having a height equal to MinBTSize implies no further vertical splitting is permitted for that binary tree node. As noted above, leaf nodes of the binary tree are referred to as CUs, and are further processed according to prediction and transform without further partitioning.

Figure 3:
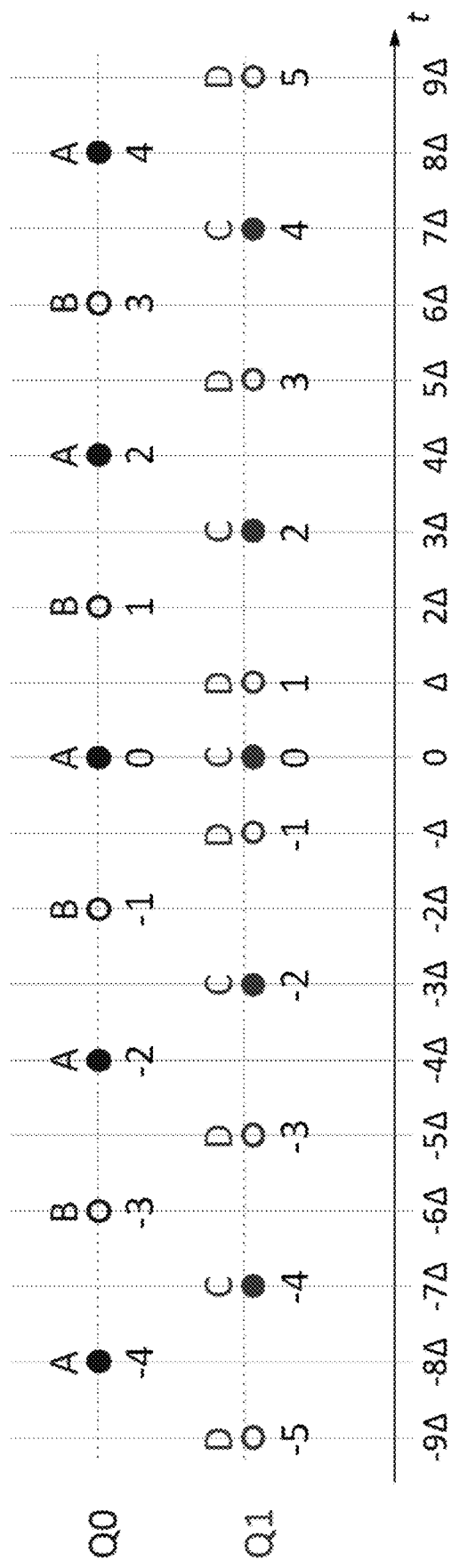
FIG. 3 is a conceptual diagram illustrating an example of how two scalar quantizers can be used to perform quantization.

FIG. 3 is a conceptual diagram illustrating an example of how two scalar quantizers can be used to perform quantization. Trellis Coded Quantization (TCQ) is a dependent quantization scheme where multiple scalar quantizers are employed to perform quantization of coefficient values. In some examples, the multiple scalar quantizers are configured with different quantization parameters. For instance, a first quantizer (e.g., Q1) may be configured with a first set of quantization parameters and a second quantizer (e.g., Q2) may be configured with a second set of quantization parameters that are different in value from the first set of quantization parameters. One particular scheme that was proposed to JVET is described in JVET-J0014, where 4-state Trellis Coded Quantization is used. Two scalar quantizers as shown in FIG. 3 may be used for performing quantization.

In particular, when using two scalar quantizers, a first quantizer Q0 may map transform coefficient levels (numbers below the points, e.g., absolute values) to even integer multiples of quantization step size Δ. The second quantizer Q1 may map the transform coefficient levels to odd integer multiples of the quantization step size Δ or to zero.

Transform coefficients may be quantized in coding order, and video encoder 200 and/or video decoder 300 may select the quantizer based on a state machine that is driven by its previous state and the parity of the level (e.g., absolute value) of the previously coded coefficient. The state machine may be represented by a data structure. An example of the state machine is described in FIG. 4.

Figure 4:
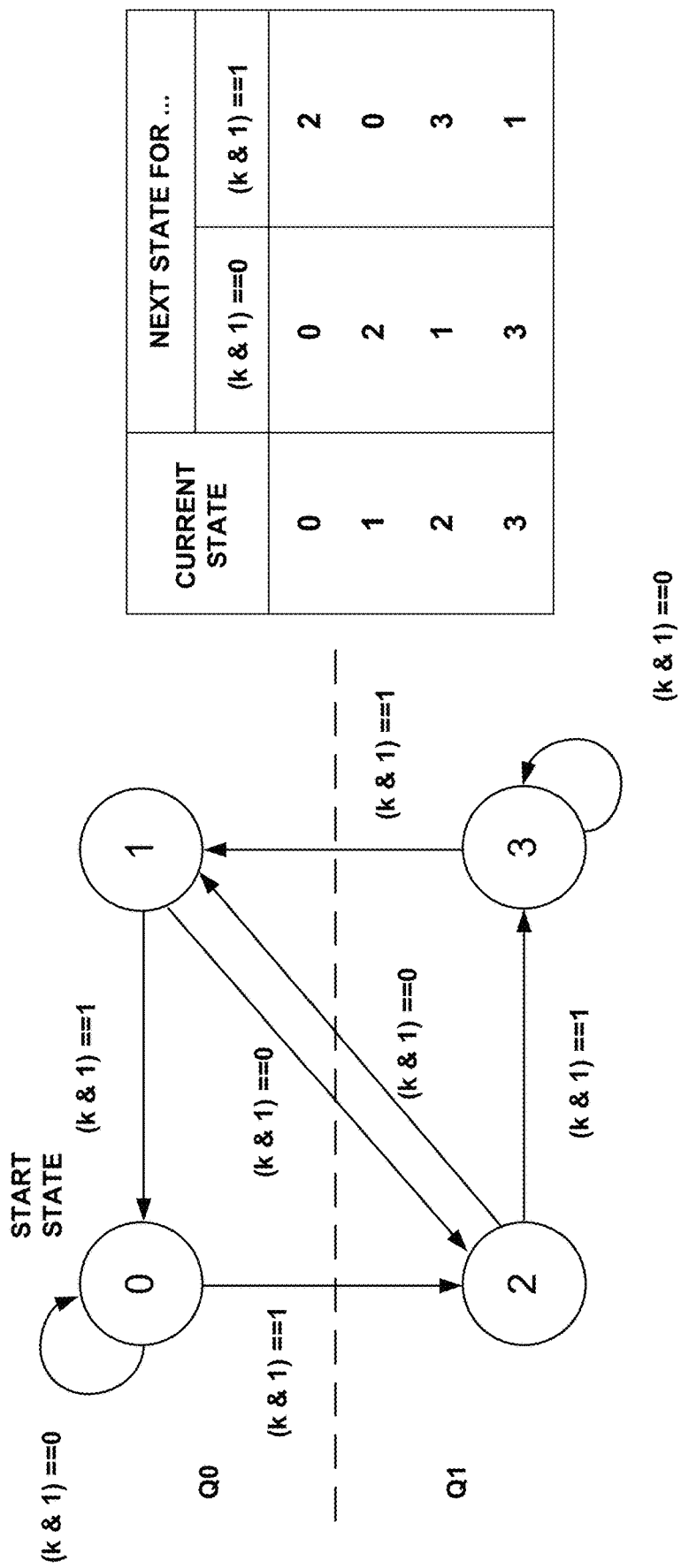
FIG. 4 is a conceptual diagram illustrating an example state transition scheme for two scalar quantizers used to perform quantization.

FIG. 4 is a conceptual diagram illustrating an example state transition scheme for two scalar quantizers used to perform quantization. In this example, coefficients in state 0 and state 1 use the Q0 (even integer multiples of stepsize) quantizer, and coefficients in states 2 and 3 use the Q1 (odd integer multiples of stepsize) quantizer. That is, video encoder 200 and/or video decoder 300 may determine a quantizer Q0 when the second state comprises state 0 or state 1. In some examples, video encoder 200 and/or video decoder 300 may determine a quantizer Q1 when the second state comprises state 2 or state 3.

As shown, the data structure of FIG. 4, transitions from state 0 to state 0, state 1 to state 2, state 2 to state 1, and state 3 to state 3 when a parity equals 0. In this example, the data structure of FIG. 4, transitions from state 0 to state 2, state 1 to state 0, state 2 to state 3, and state 3 to state 1 when the parity equals 1. As shown, the data structure of FIG. 4 may include a state machine.

In this scheme, coefficients may be quantized in coefficient coding order. In the JVET-J0014 scheme, the entire coefficient level must be coded before moving to the coding of the next coefficient. The reason for this is that the significance (greater than zero or "gt0") map (the absolute value of coefficient level greater than 0) and greater than 1 (gt1) map context used in context based arithmetic coding depends on the state that is driven by the previous state and the parity of the coefficient level. In the JVET-J0014 scheme, in order to obtain the coefficient level parity, the entire level of a coefficient has to be coded before moving on to the next coefficient.

In HEVC, coefficients are coded in bitplane by bitplane order (partially), where first in a coefficient group, gt0 flags of all coefficients are coded, which is followed by a gt1 flag, and followed by a greater than 2 (gt2) flag. The rest of the levels are coded as absolute value of the remaining coefficient level in bypass mode. The gt0, gt1, gt2 flags are context coded. The main motivation for using this approach is to group all bypass coded bins for simpler parsing. Also, not mixing the order of the bitplanes simplifies multi-bin decoding, where contexts for sequentially decoded coefficients do not depend on the previous coefficient (breaks the dependency), and reduces the cases where speculative decoding needs to be performed (when the next bin to be decoded could belong to a different bitplane). This kind of design improves the arithmetic coding throughput.

The TCQ scheme described in JVET-J0014 breaks this scheme by requiring all bitplanes of a coefficient to be decoded before moving on the next. It also interleaves the bypass and context coded bins making multi-bin arithmetic coding difficult.

In this disclosure, an alternative scheme that reduces the dependency on requiring full reconstruction of a coefficient level for utilizing TCQ is described.

In particular, according to the techniques of this disclosure, video encoder 200 and video decoder 300 may code (encode or decode, respectively) a significance map for a block of video data using a context (causal or position based) that is dependent on position and/or significance of neighboring coefficients. Video encoder 200 and video decoder 300 may employ similar schemes for coding of gt1 and gt2 flags that depend on position or on number of coefficients that are gt1 and gt2 in the causal neighborhood, respectively. In the TCQ scheme of this disclosure, video encoder 200 and video decoder 300 may use separate context models for significance and greater than one coefficient contexts based on the current state (even or odd reconstruction level quantizer) used. Basically, video encoder 200 and video decoder 300 may maintain a separate context model for even and odd quantizers. In one example, if the current state is 0 or 1, then context set 0 is used, whereas if the current state is 2 or 3, then context set 1 is used. Switching between the context sets can be achieved by changing the parity of the level of the previous coefficients that minimizes the RD cost. Switching between the context sets may also change the quantizer, hence the reconstruction levels.

In accordance with techniques described in this disclosure, if video encoder 200 and video decoder 300 use a bitplane based coding scheme, instead of using the parity of the coded level of the previous coefficient, video encoder 200 and video decoder 300 may use a parity of the partial or complete coefficient levels to drive a state machine. Said differently, for example, video encoder 200 and video decoder 300 may use a partial set of syntax elements representing a partial set of a plurality of coefficient levels parity to drive a state machine. In some examples, the partial set may include one or more of the greater than zero syntax element, a greater than one syntax element, or a greater than two syntax element. For instance, a partial set may include only the greater than zero syntax element. In some instances, a partial set may include only the greater than zero syntax element and a greater than one syntax element. For instance, the partial set of syntax elements may exclude syntax elements representing values of remaining level values for coefficients having values greater than two (e.g., a greater than two syntax level, a greater than three syntax level, a remaining syntax level, etc.). In some instances, the partial set may include only the greater than zero syntax element, a greater than one syntax element, and a greater than two syntax element. In some examples, the partial set may include one or more of the greater than zero syntax element, a greater than one syntax element, or a greater than three syntax element. For instance, a partial set may include only the greater than zero syntax element, a greater than one syntax element, and a greater than three syntax element.

For example, video encoder 200 and video decoder 300 may determine a partial set of syntax elements representing a partial set of a plurality of coefficient levels for a previous transform coefficient up to a certain bitplane level (e.g., a greater than one level, a greater than three level, etc.) of the plurality of coefficient levels for the previous transform coefficient that is less than all of the plurality of coefficient levels for the previous transform coefficient. Said differently, for example, video encoder 200 and video decoder 300 may determine a partial set of syntax elements (e.g., a greater than zero syntax element, a greater than one syntax element, etc.) representing a certain coefficient level of the plurality of coefficient levels for the previous transform coefficient that is less than a full set of syntax elements representing all of the plurality of coefficient levels for the previous transform coefficient. In this example, after driving the state machine to determine a quantizer, video encoder 200 and video decoder 300 may determine all of the plurality of coefficient levels (e.g., an absolute value) for the previous transform coefficient. Said differently, for example, video encoder 200 and video decoder 300 may determine the full set of syntax elements representing all of the plurality of coefficient levels for the previous transform coefficient.

In some examples, video encoder 200 and video decoder 300 may determine a second partial set of a plurality of coefficient levels for a current transform coefficient up to a certain bitplane level (e.g., a greater than one level, a greater than three level, etc.) that is less than all of the plurality of coefficient levels for the current transform coefficient and, after determining the second partial set, video encoder 200 and video decoder 300 may decode all of the plurality of coefficient levels for the previous transform coefficient. That is, video encoder 200 and video decoder 300 may determine a second partial set of syntax elements representing a partial set of a plurality of coefficient levels for the current transform coefficient up to a certain set of syntax elements representing a certain coefficient level of the plurality of coefficient levels for the current transform coefficient that is less than a full set of syntax elements representing all of the plurality of coefficient levels for the current transform coefficient. For instance, video encoder 200 and video decoder 300 may bypass code or bypass decode a set of syntax elements representing remaining levels (e.g., an absolute value) of the plurality of coefficient levels for the previous transform coefficient and a set of syntax elements representing remaining levels of the plurality of coefficient levels for the current transform coefficient.

By this scheme of using a partial set to determine parity, for example, there would be no need for video encoder 200 and video decoder 300 to decode a full set of syntax elements representing the full coefficient (e.g., all of the plurality of coefficient levels for the current transform coefficient) to drive the state machine. Also, for example, video encoder 200 and video decoder 300 may use an altered bitplane by bitplane scheme to code one or more syntax element up to a certain bitplane level (e.g., gt2), before moving to code the gt0 of the next coefficient. At the end, for example, video encoder 200 and video decoder 300 may code a set of syntax elements representing all remaining absolute levels in bypass mode. This way, video encoder 200 and video decoder 300 may permit the parity to be from a set of syntax elements representing higher bitplanes.

Said differently, for example, video encoder 200 and/or video decoder 300 may determine a partial set of syntax elements up to a certain set of syntax elements representing a certain coefficient level of the plurality of coefficient levels for the previous transform coefficient that is less than a full set of syntax elements representing all of the plurality of coefficient levels for the previous transform coefficient. In this example, video encoder 200 and video decoder 300 may determine, after determining a quantizer to be used to quantize or inverse quantize a current value of a current transform coefficient, the full set of syntax elements representing all of the plurality of coefficient levels for the previous transform coefficient (and the full set of syntax elements representing all of the plurality of coefficient levels for the current transform coefficient). In some examples, video encoder 200 and/or video decoder 300 may determine a second partial set of syntax elements representing a partial set of a plurality of coefficient levels for the current transform coefficient up to a certain set of syntax elements representing a certain coefficient level of the plurality of coefficient levels for the current transform coefficient that is less than a full set of syntax elements representing all of the plurality of coefficient levels for the current transform coefficient and, after determining the second partial set, determine the full set of syntax elements representing all of the plurality of coefficient levels for the current transform coefficients.

In some examples, video encoder 200 and video decoder 300 may use an alternative scheme drives the state machine based on a parity of the number of nonzero coefficients in a neighborhood of the coefficient that is being coded. In JEM coding scheme, for example, video encoder 200 and video decoder 300 may code a significance map using a template of 5 neighboring pixels. Video encoder 200 and video decoder 300 may use the same template or another template to derive the parity of the number of nonzero coefficients.

In some examples, video encoder 200 and video decoder 300 may use another scheme to code the least significant bit (LSB) of a coefficient (that determines the level's parity), right after the significance (e.g., gt0) of a coefficient in an interleaved fashion with gt0. For example, video encoder 200 and video decoder 300 may determine the parity for a previous transform coefficient after determining the greater than zero level for the previous transform coefficient and before determining all of the plurality of coefficient levels for the previous transform coefficient. In this way, using the LSB information of a coefficient, video encoder 200 and video decoder 300 may drive the TCQ state machine using the state transition scheme defined in JVET-J0014.

In an example JVET-J0014 TCQ scheme, gt0 and gt1 may be coded with two sets of context model. One context model may be used for states 0 and 1, and the other context model may be used for states 2 and 3. Using a separate context model for gt1 based on the current state may not improve the coding performance. In accordance with techniques described in this disclosure, the dependency of the gt1 context on the TCQ state is removed and hence, only gt0 context would utilize separate context models for the pair of states 0 and 1 and the pair of states 2 and 3. Said differently, for example, video encoder 200 and video decoder 300 may use separate context models for state 0 and 1 pair and the state 2 and 3 pair for only gt0 context.

In particular, according to the techniques of this disclosure, video encoder 200 and video decoder 300 may code (encode or decode, respectively) a significance map for a block of video data using a context (causal or position based) that is dependent on position and/or significance of neighboring coefficients. Video encoder 200 and video decoder 300 may employ similar schemes for coding of gt1 and gt2 flags that depend on position or on number of coefficients that are gt1 and gt2 in the causal neighborhood, respectively. In the TCQ scheme of this disclosure, video encoder 200 and video decoder 300 may use separate context models for significance and greater than one coefficient contexts based on the current state (even or odd reconstruction level quantizer) used. Basically, video encoder 200 and video decoder 300 may maintain a separate context model for even and odd quantizers. In one example, if the current state is 0 or 1, then context set 0 is used, whereas if the current state is 2 or 3, then context set 1 is used. Switching between the context sets can be achieved by changing the parity of the level of the previous coefficients that minimizes the RD cost. Switching between the context sets may also change the quantizer, hence the reconstruction levels.

Figure 5:
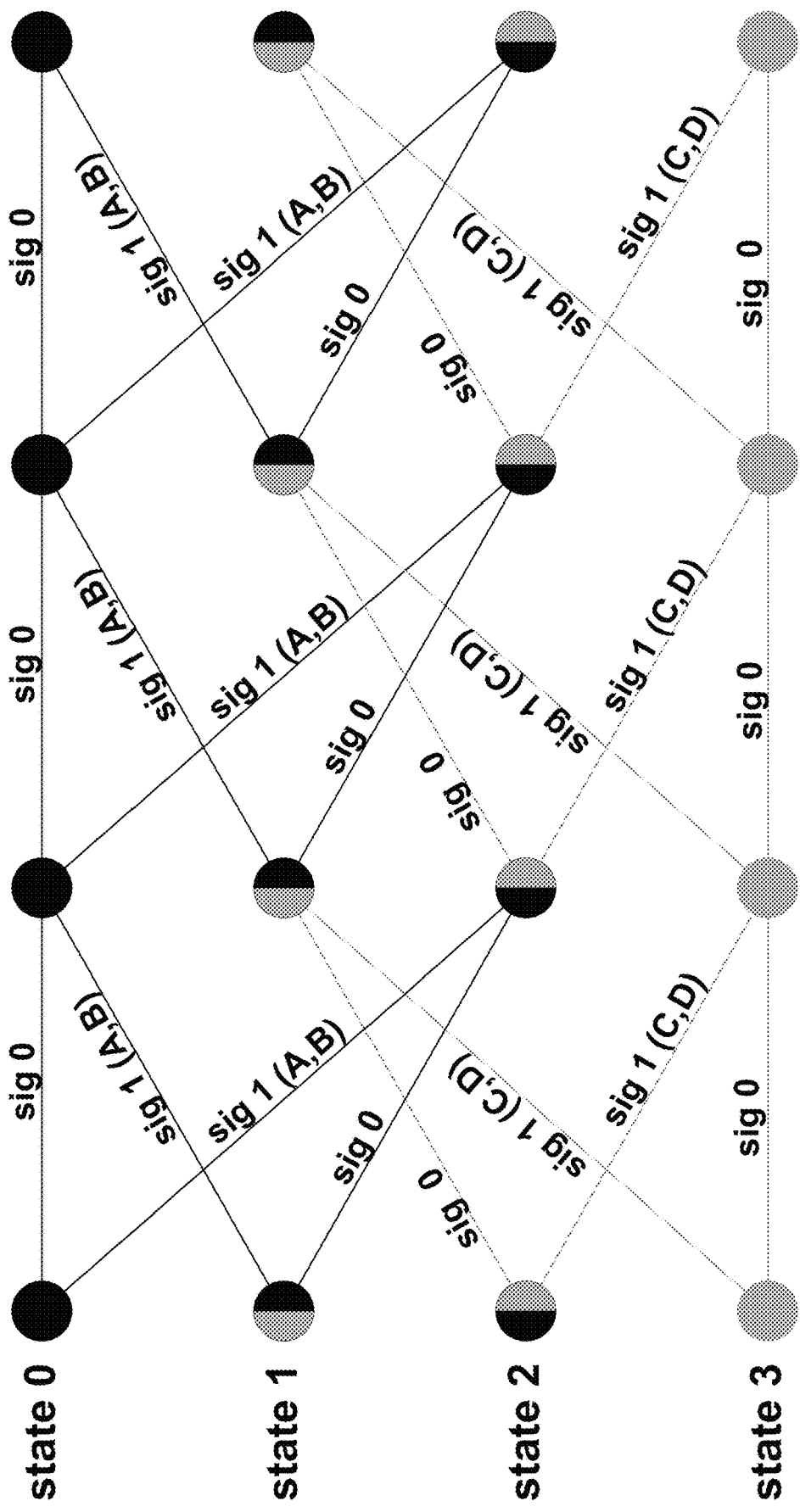
FIG. 5 is a conceptual diagram illustrating an example trellis diagram that may be used for a coefficient significance based state machine according to the techniques of this disclosure.

FIG. 5 is a conceptual diagram illustrating an example trellis diagram that may be used for a coefficient significance based state machine according to the techniques of this disclosure. As shown, the data structure of FIG. 5, transitions from state 0 to state 0, state 1 to state 2, state 2 to state 1, and state 3 to state 3 when a significance (e.g., gt0) equals 0. In this example, the data structure of FIG. 4, transitions from state 0 to state 2, state 1 to state 0, state 2 to state 3, and state 3 to state 1 when the significance (e.g., gt0) equals 1. While the example of FIG. 5 illustrates using a significance (e.g., gt0), in some examples, other bitplane levels may be used, for example, but not limited to, gt1, gt2, or another bitplane level.

Figure 6:
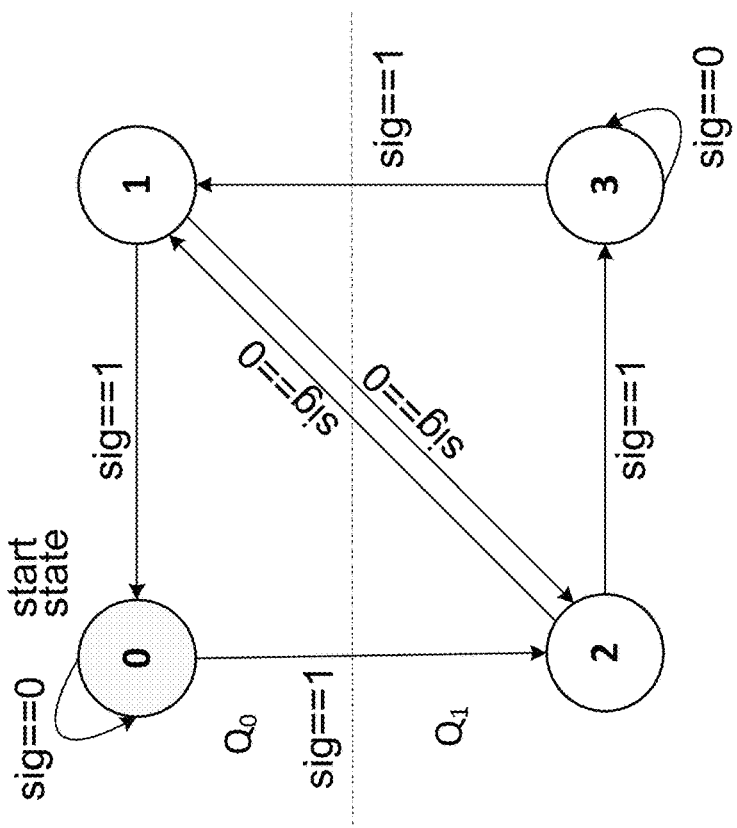
FIG. 6 is a conceptual diagram illustrating an example significance driven state transitioning scheme according to the techniques of this disclosure.

FIG. 6 is a conceptual diagram illustrating an example significance driven state transitioning scheme according to the techniques of this disclosure. According to the techniques of this disclosure, instead of using the parity of a previously quantized coefficient level, significance (e.g., zero or nonzero level of the quantized coefficients) can be used to drive the state machine. Video encoder 200 and video decoder 300 may use significance of the previously quantized coefficient along with the previous state to determine the next state for the state machine, as shown in FIG. 6. The updated state defines the quantizer to be used to quantize or dequantize the current coefficient. Specifically, video encoder 200 and video decoder 300 may use Q0 if the current state is 0 or 1, or Q1 if the current state is 2 or 3. Video encoder 200 may use an optimization of these techniques by employing the trellis diagram shown in FIG. 5, where the stages in the horizontal direction from left to right represent the quantized coefficients in the scanning order. "sig 0" means the quantized coefficient is zero, whereas "sig 1" means the quantized coefficient is not zero, no matter if it is A or B by Q0, or C or D by Q1. The meanings of A, B, C, and D are described with respect to FIG. 3. The output of this proposed dependent quantization scheme will be converted into binary representation (e.g., part of the bitstream) by transform coefficient coding.

In one example, the transform coefficient coding can be any existing scheme, such as the schemes of HEVC or that implemented in testing model JEM.

In another example, the existing transform coefficient coding schemes may be modified, such that the approach to coding (in video encoder 200) or parsing (in video decoder 300) one quantized coefficient depends on the quantizer (Q0 or Q1) used to produce that coefficient. For example, the approach may differ in the context modeling process, which means one set of context models may be used for the quantized coefficients by Q0 and another set may be used for those by Q1. Such adaptation is possible, if the same state machine as shown in FIG. 5 is implemented in transform coefficient coding and driven properly, such that the current state (i.e., the right quantizer) is determined while coding/parsing the current quantized coefficient. This requires the state machine being driven by causal information. The proposed state machine, which is significance driven, satisfies this requirement, even if the transform coefficient coding is a kind of bitplane by bitplane scheme. Therefore, for a bitplane by bitplane scheme, e.g., the one implemented in JEM, the significance and possibly the greater than 1, greater than 2, etc. bit planes of the quantized coefficients by Q0 can have their own sets of context models that are different from the context models for the quantized coefficients by Q1.

Besides using the significance (gt0) or the parity of the quantized coefficient, video encoder 200 and video decoder 300 can also use gtx (e.g., gt1, gt2, . . . ) to drive the state machine, in some examples. The figures of the state machine and the encoder side trellis may be similar to FIGS. 5 and 6, except that "sig" would be replaced with "gtx." In transform coefficient coding, especially the bitplane by bitplane scheme, to achieve the aforementioned adaptation of context modeling according to the quantizer being used, video encoder 200 or video decoder 300 may code/parse up to the bitplane level gtx of the current coefficient, before moving to code/parse the gt0 of the next coefficient, so that the information (e.g., gtx) used to drive the state machine is always causal. At the end, all remaining absolute levels can be coded in bypass mode. Said differently, for example, video encoder 200 and/or video decoder 300 may bypass encode or bypass decode remaining levels a plurality of coefficient levels for a previous transform coefficient and remaining levels of a plurality of coefficient levels for a current transform coefficient.

An alternative scheme that may be employed by video encoder 200 and video decoder 300 is to derive the state machine based on significances of a neighborhood of the coefficient that is being coded or a set of significance values from previously decoded significance values.

Furthermore, sign data hiding with significance driven TCQ can be achieved as a post quantization step. In HEVC sign data hiding, if there are enough coefficients in a coefficient group, one of the sign bits is not coded, but rather inferred. The missing sign is inferred to be equal to the least significant bit of the sum of all the coefficient's absolute values. If the missing derived sign does not correspond to the actual sign of the coefficient, then one of the levels in the coefficient 4×4 group (CG) is altered to get the correct sign. This mechanism is enabled if there is more than a 4 coefficient scan distance between the first and the last significant coefficient in a CG. In the HEVC method, during the level alteration, coefficients can become zero or zero coefficients can become nonzero. This method would not work with TCQ, since sign data hiding would alter the state machine if performed after TCQ.

In order to not to change the significance driven trellis, in sign data hiding, nonzero coefficients should not be altered to be zero, and vice-versa. Instead of using the distance between first and last nonzero coefficient as a threshold to enable sign data hiding, video encoder 200 and video decoder 300 may use a certain number of nonzero coefficients in scan order or in a CG as a threshold to enable sign data hiding. Video encoder 200 and video decoder 300 may derive the sign of the ordinal last coefficient in the group in scan order or alternatively in a CG from the parity of the sum of the levels in the group.

Figure 7:
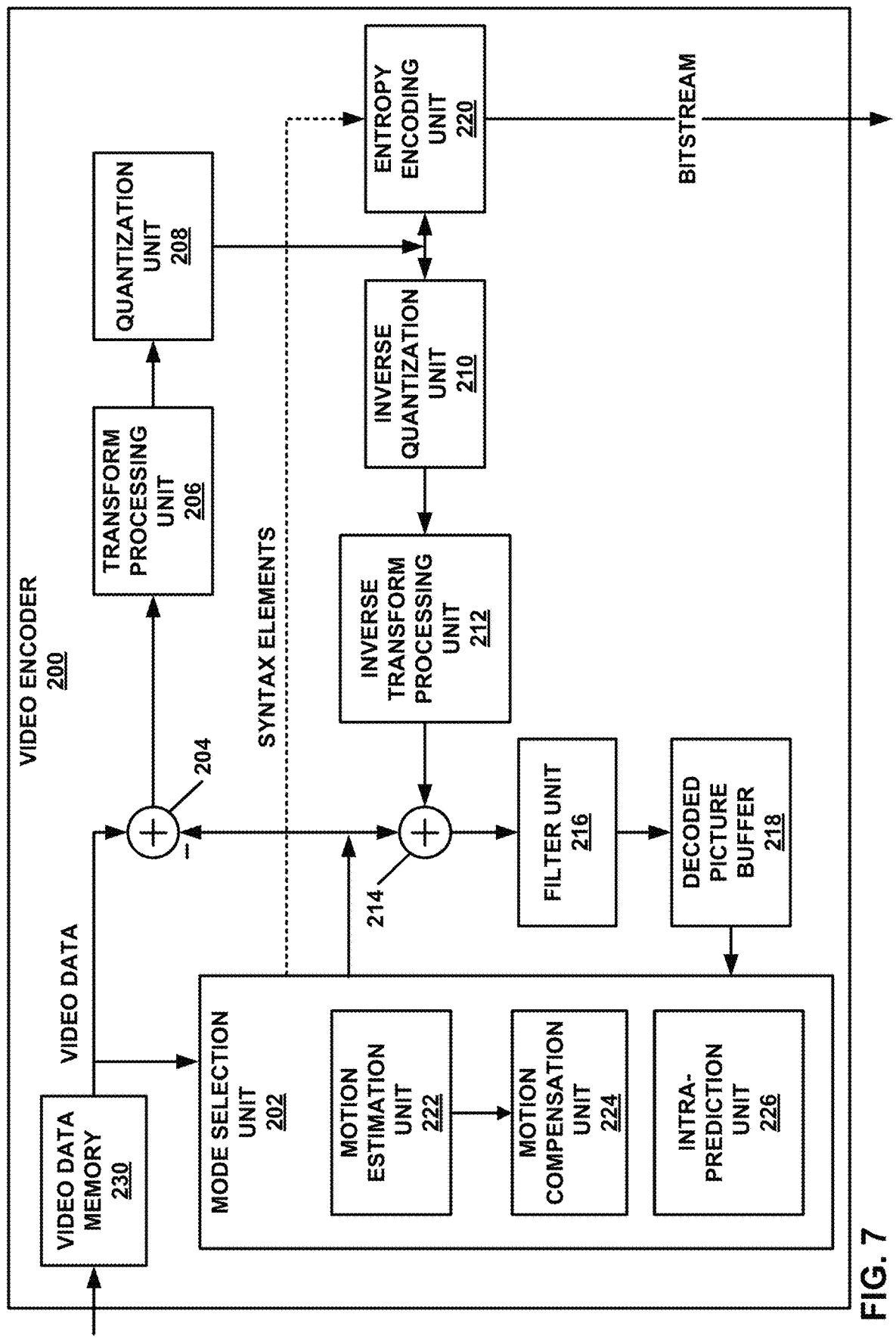
FIG. 7 is a block diagram illustrating an example video encoder that may perform the techniques of this disclosure.

FIG. 7 is a block diagram illustrating an example video encoder 200 that may perform the techniques of this disclosure. FIG. 7 is provided for purposes of explanation and should not be considered limiting of the techniques as broadly exemplified and described in this disclosure. For purposes of explanation, this disclosure describes video encoder 200 in the context of video coding standards such as the HEVC video coding standard and the H.266 video coding standard in development. However, the techniques of this disclosure are not limited to these video coding standards, and are applicable generally to video encoding and decoding.

In the example of FIG. 7, video encoder 200 includes video data memory 230, mode selection unit 202, residual generation unit 204, transform processing unit 206, quantization unit 208, inverse quantization unit 210, inverse transform processing unit 212, reconstruction unit 214, filter unit 216, decoded picture buffer (DPB) 218, and entropy encoding unit 220.

Video data memory 230 may store video data to be encoded by the components of video encoder 200. Video encoder 200 may receive the video data stored in video data memory 230 from, for example, video source 104 (FIG. 1).

DPB 218 may act as a reference picture memory that stores reference video data for use in prediction of subsequent video data by video encoder 200. Video data memory 230 and DPB 218 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 230 and DPB 218 may be provided by the same memory device or separate memory devices. In various examples, video data memory 230 may be on-chip with other components of video encoder 200, as illustrated, or off-chip relative to those components.

In this disclosure, reference to video data memory 230 should not be interpreted as being limited to memory internal to video encoder 200, unless specifically described as such, or memory external to video encoder 200, unless specifically described as such. Rather, reference to video data memory 230 should be understood as reference memory that stores video data that video encoder 200 receives for encoding (e.g., video data for a current block that is to be encoded). Memory 106 of FIG. 1 may also provide temporary storage of outputs from the various units of video encoder 200.

The various units of FIG. 7 are illustrated to assist with understanding the operations performed by video encoder 200. The units may be implemented as fixed-function circuits, programmable circuits, or a combination thereof. Fixed-function circuits refer to circuits that provide particular functionality, and are preset on the operations that can be performed. Programmable circuits refer to circuits that can be programmed to perform various tasks, and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, the one or more of the units may be distinct circuit blocks (fixed-function or programmable), and in some examples, the one or more units may be integrated circuits.

Video encoder 200 may include arithmetic logic units (ALUs), elementary function units (EFUs), digital circuits, analog circuits, and/or programmable cores, formed from programmable circuits. In examples where the operations of video encoder 200 are performed using software executed by the programmable circuits, memory 106 (FIG. 1) may store the object code of the software that video encoder 200 receives and executes, or another memory within video encoder 200 (not shown) may store such instructions.

Video data memory 230 is configured to store received video data. Video encoder 200 may retrieve a picture of the video data from video data memory 230 and provide the video data to residual generation unit 204 and mode selection unit 202. Video data in video data memory 230 may be raw video data that is to be encoded.

Mode selection unit 202 includes a motion estimation unit 222, motion compensation unit 224, and an intra-prediction unit 226. Mode selection unit 202 may include additional functional units to perform video prediction in accordance with other prediction modes. As examples, mode selection unit 202 may include a palette unit, an intra-block copy unit (which may be part of motion estimation unit 222 and/or motion compensation unit 224), an affine unit, a linear model (LM) unit, or the like.

Mode selection unit 202 generally coordinates multiple encoding passes to test combinations of encoding parameters and resulting rate-distortion values for such combinations. The encoding parameters may include partitioning of CTUs into CUs, prediction modes for the CUs, transform types for residual data of the CUs, quantization parameters for residual data of the CUs, and so on. Mode selection unit 202 may ultimately select the combination of encoding parameters having rate-distortion values that are better than the other tested combinations.

Video encoder 200 may partition a picture retrieved from video data memory 230 into a series of CTUs, and encapsulate one or more CTUs within a slice. Mode selection unit 210 may partition a CTU of the picture in accordance with a tree structure, such as the QTBT structure or the quad-tree structure of HEVC described above. As described above, video encoder 200 may form one or more CUs from partitioning a CTU according to the tree structure. Such a CU may also be referred to generally as a "video block" or "block."

In general, mode selection unit 202 also controls the components thereof (e.g., motion estimation unit 222, motion compensation unit 224, and intra-prediction unit 226) to generate a prediction block for a current block (e.g., a current CU, or in HEVC, the overlapping portion of a PU and a TU). For inter-prediction of a current block, motion estimation unit 222 may perform a motion search to identify one or more closely matching reference blocks in one or more reference pictures (e.g., one or more previously coded pictures stored in DPB 218). In particular, motion estimation unit 222 may calculate a value representative of how similar a potential reference block is to the current block, e.g., according to sum of absolute difference (SAD), sum of squared differences (SSD), mean absolute difference (MAD), mean squared differences (MSD), or the like. Motion estimation unit 222 may generally perform these calculations using sample-by-sample differences between the current block and the reference block being considered. Motion estimation unit 222 may identify a reference block having a lowest value resulting from these calculations, indicating a reference block that most closely matches the current block.

Motion estimation unit 222 may form one or more motion vectors (MVs) that defines the positions of the reference blocks in the reference pictures relative to the position of the current block in a current picture. Motion estimation unit 222 may then provide the motion vectors to motion compensation unit 224. For example, for uni-directional inter-prediction, motion estimation unit 222 may provide a single motion vector, whereas for bi-directional inter-prediction, motion estimation unit 222 may provide two motion vectors. Motion compensation unit 224 may then generate a prediction block using the motion vectors. For example, motion compensation unit 224 may retrieve data of the reference block using the motion vector. As another example, if the motion vector has fractional sample precision, motion compensation unit 224 may interpolate values for the prediction block according to one or more interpolation filters. Moreover, for bi-directional inter-prediction, motion compensation unit 224 may retrieve data for two reference blocks identified by respective motion vectors and combine the retrieved data, e.g., through sample-by-sample averaging or weighted averaging.

As another example, for intra-prediction, or intra-prediction coding, intra-prediction unit 226 may generate the prediction block from samples neighboring the current block. For example, for directional modes, intra-prediction unit 226 may generally mathematically combine values of neighboring samples and populate these calculated values in the defined direction across the current block to produce the prediction block. As another example, for DC mode, intra-prediction unit 226 may calculate an average of the neighboring samples to the current block and generate the prediction block to include this resulting average for each sample of the prediction block.

Mode selection unit 202 provides the prediction block to residual generation unit 204. Residual generation unit 204 receives a raw, uncoded version of the current block from video data memory 230 and the prediction block from mode selection unit 202. Residual generation unit 204 calculates sample-by-sample differences between the current block and the prediction block. The resulting sample-by-sample differences define a residual block for the current block. In some examples, residual generation unit 204 may also determine differences between sample values in the residual block to generate a residual block using residual differential pulse code modulation (RDPCM). In some examples, residual generation unit 204 may be formed using one or more subtractor circuits that perform binary subtraction.

In examples where mode selection unit 202 partitions CUs into PUs, each PU may be associated with a luma prediction unit and corresponding chroma prediction units. Video encoder 200 and video decoder 300 may support PUs having various sizes. As indicated above, the size of a CU may refer to the size of the luma coding block of the CU and the size of a PU may refer to the size of a luma prediction unit of the PU. Assuming that the size of a particular CU is 2N×2N, video encoder 200 may support PU sizes of 2N×2N or N×N for intra prediction, and symmetric PU sizes of 2N×2N, 2N×N, N×2N, N×N, or similar for inter prediction. Video encoder 20 and video decoder 30 may also support asymmetric partitioning for PU sizes of 2N×nU, 2N×nD, nL×2N, and nR×2N for inter prediction.

In examples where mode selection unit does not further partition a CU into PUs, each CU may be associated with a luma coding block and corresponding chroma coding blocks. As above, the size of a CU may refer to the size of the luma coding block of the CU. The video encoder 200 and video decoder 200 may support CU sizes of 2N×2N, 2N×N, or N×2N.

For other video coding techniques such as an intra-block copy mode coding, an affine-mode coding, and linear model (LM) mode coding, as few examples, mode selection unit 202, via respective units associated with the coding techniques, generates a prediction block for the current block being encoded. In some examples, such as palette mode coding, mode selection unit 202 may not generate a prediction block, and instead generate syntax elements that indicate the manner in which to reconstruct the block based on a selected palette. In such modes, mode selection unit 202 may provide these syntax elements to entropy encoding unit 220 to be encoded.

As described above, residual generation unit 204 receives the video data for the current block and the corresponding prediction block. Residual generation unit 204 then generates a residual block for the current block. To generate the residual block, residual generation unit 204 calculates sample-by-sample differences between the prediction block and the current block.

Transform processing unit 206 applies one or more transforms to the residual block to generate a block of transform coefficients (referred to herein as a "transform coefficient block"). Transform processing unit 206 may apply various transforms to a residual block to form the transform coefficient block. For example, transform processing unit 206 may apply a discrete cosine transform (DCT), a directional transform, a Karhunen-Loeve transform (KLT), or a conceptually similar transform to a residual block. In some examples, transform processing unit 206 may perform multiple transforms to a residual block, e.g., a primary transform and a secondary transform, such as a rotational transform. In some examples, transform processing unit 206 does not apply transforms to a residual block.

Quantization unit 208 may quantize the transform coefficients in a transform coefficient block, to produce a quantized transform coefficient block. Quantization unit 208 may quantize transform coefficients of a transform coefficient block according to a quantization parameter (QP) value associated with the current block. Video encoder 200 (e.g., via mode selection unit 202) may adjust the degree of quantization applied to the coefficient blocks associated with the current block by adjusting the QP value associated with the CU. Quantization may introduce loss of information, and thus, quantized transform coefficients may have lower precision than the original transform coefficients produced by transform processing unit 206.

Quantization unit 208 may use any of the various techniques of this disclosure to perform quantization, e.g., trellis coded quantization using a significance map (or greater than 1 or 2 flags), as discussed above. In some examples, quantization unit 208 may use any of the various techniques of this disclosure to perform quantization, e.g., trellis coded quantization using a parity of a partial set of syntax elements, deriving the state machine based on a parity of the number of nonzero coefficients in a neighborhood of coefficient that is being coded, coding a least significant bit of a coefficient right after the significance (e.g., gt0) of a coefficient in an interleaved fashion with gt0, removing dependency of the gt1 context on the TCQ state, etc.), as discussed above.

Inverse quantization unit 210 and inverse transform processing unit 212 may apply inverse quantization and inverse transforms to a quantized transform coefficient block, respectively, to reconstruct a residual block from the transform coefficient block. Reconstruction unit 214 may produce a reconstructed block corresponding to the current block (albeit potentially with some degree of distortion) based on the reconstructed residual block and a prediction block generated by mode selection unit 202. For example, reconstruction unit 214 may add samples of the reconstructed residual block to corresponding samples from the prediction block generated by mode selection unit 202 to produce the reconstructed block.

Filter unit 216 may perform one or more filter operations on reconstructed blocks. For example, filter unit 216 may perform deblocking operations to reduce blockiness artifacts along edges of CUs. Operations of filter unit 216 may be skipped, in some examples.

Video encoder 200 stores reconstructed blocks in DPB 218. For instance, in examples where operations of filter unit 224 are not needed, reconstruction unit 214 may store reconstructed blocks to DPB 218. In examples where operations of filter unit 224 are needed, filter unit 216 may store the filtered reconstructed blocks to DPB 218. Motion estimation unit 222 and motion compensation unit 224 may retrieve a reference picture from DPB 218, formed from the reconstructed (and potentially filtered) blocks, to inter-predict blocks of subsequently encoded pictures. In addition, intra-prediction unit 226 may use reconstructed blocks in DPB 218 of a current picture to intra-predict other blocks in the current picture.

In general, entropy encoding unit 220 may entropy encode syntax elements received from other functional components of video encoder 200. For example, entropy encoding unit 220 may entropy encode quantized transform coefficient blocks from quantization unit 208. As another example, entropy encoding unit 220 may entropy encode prediction syntax elements (e.g., motion information for inter-prediction or intra-mode information for intra-prediction) from mode selection unit 202. Entropy encoding unit 220 may perform one or more entropy encoding operations on the syntax elements, which are another example of video data, to generate entropy-encoded data. For example, entropy encoding unit 220 may perform a context-adaptive variable length coding (CAVLC) operation, a CABAC operation, a variable-to-variable (V2V) length coding operation, a syntax-based context-adaptive binary arithmetic coding (SBAC) operation, a Probability Interval Partitioning Entropy (PIPE) coding operation, an Exponential-Golomb encoding operation, or another type of entropy encoding operation on the data. In some examples, entropy encoding unit 220 may operate in bypass mode where syntax elements are not entropy encoded.

Entropy encoding unit 220 may also use the various techniques of this disclosure related to trellis coded quantization using a significance map to determine contexts for context encoding values of syntax elements, such as significant coefficient flags, greater than 1 flags, greater than 2 flags, or the like.

Video encoder 200 may output a bitstream that includes the entropy encoded syntax elements needed to reconstruct blocks of a slice or picture. In particular, entropy encoding unit 220 may output the bitstream.

The operations described above are described with respect to a block. Such description should be understood as being operations for a luma coding block and/or chroma coding blocks. As described above, in some examples, the luma coding block and chroma coding blocks are luma and chroma components of a CU. In some examples, the luma coding block and the chroma coding blocks are luma and chroma components of a PU.

In some examples, operations performed with respect to a luma coding block need not be repeated for the chroma coding blocks. As one example, operations to identify a motion vector (MV) and reference picture for a luma coding block need not be repeated for identifying a MV and reference picture for the chroma blocks. Rather, the MV for the luma coding block may be scaled to determine the MV for the chroma blocks, and the reference picture may be the same. As another example, the intra-prediction process may be the same for the luma coding blocks and the chroma coding blocks.

Video encoder 200 represents an example of a video encoder configured to determine a first state of a data structure, the first state representing a first quantizer applied to a previously quantized value of a previous transform coefficient of residual data for a block of video data, update the data structure to a second state according to the first state and a parity of a partial set of syntax elements representing a partial set of a plurality of coefficient levels for the previous transform coefficient, determine a second quantizer to be used to quantize a current value of a current transform coefficient according to the second state of the data structure, and quantize the current value of the current transform coefficient using the second quantizer.

Video encoder 200 also represents an example of a video encoder configured to determine a first state of a data structure, the first state representing a first quantizer applied to a previously quantized value of a previous transform coefficient of residual data for a block of video data, update the data structure to a second state according to the first state and a parity of a number of nonzero coefficients in a neighborhood of a current value of a current transform coefficient that is being coded, determine a second quantizer to be used to quantize the current value of the current transform coefficient according to the second state of the data structure, and quantize the current value of the current transform coefficient using the second quantizer.

Video encoder 200 also represents an example of a video encoder configured to code a least significant bit of a previous transform coefficient of residual data for a block of video data, and code, in an interleaved fashion with coding the least significant bit of the previous transform coefficient, a significance of a current transform coefficient that is being coded, wherein coding the significance of the current transform coefficient comprises: determining a first state of a data structure, the first state representing a first quantizer applied to a previously quantized value of a previous transform coefficient of residual data for a block of video data, updating the data structure to a second state according to the first state and a parity based on the least significant bit of the previous transform coefficient, determining a second quantizer to be used to quantize the current value of the current transform coefficient according to the second state of the data structure, and quantizing or inverse quantizing the current value of the current transform coefficient using the second quantizer.

Video encoder 200 also represents an example of a video encoder configured to determine a current context to be used to code a current value of a greater than zero syntax element for a current transform coefficient according to a state of a data structure, code the current value of the greater than zero syntax element using the current context, and code a current value of a greater than one syntax element for the current transform coefficient using a predetermined context that is independent from the state of the data structure.

In some examples, video encoder 200 represents an example of a video encoder configured to determine a first state of a data structure, the first state representing a first quantizer applied to a previously quantized or inverse quantized value of a previous transform coefficient of residual data for a block of video data, update the data structure to a second state according to the first state and whether the previous transform coefficient had an absolute value greater than a threshold, determine a second quantizer to be used to quantize or inverse quantize a current value of a current transform coefficient according to the second state of the data structure, and quantize the current value of the current transform coefficient using the second quantizer.

Video encoder 200 also represents an example of a video encoder configured to determine a first state of a data structure, the first state representing a previous context used to code a previous value of a syntax element for a previous transform coefficient of residual data for a block of video data, update the data structure to a second state according to the first state and whether the previous transform coefficient had an absolute value greater than a threshold, determine a current context to be used to code a current value of the syntax element for a current transform coefficient according to the second state of the data structure, and entropy encode the current value of the syntax element using the current context.

Figure 8:
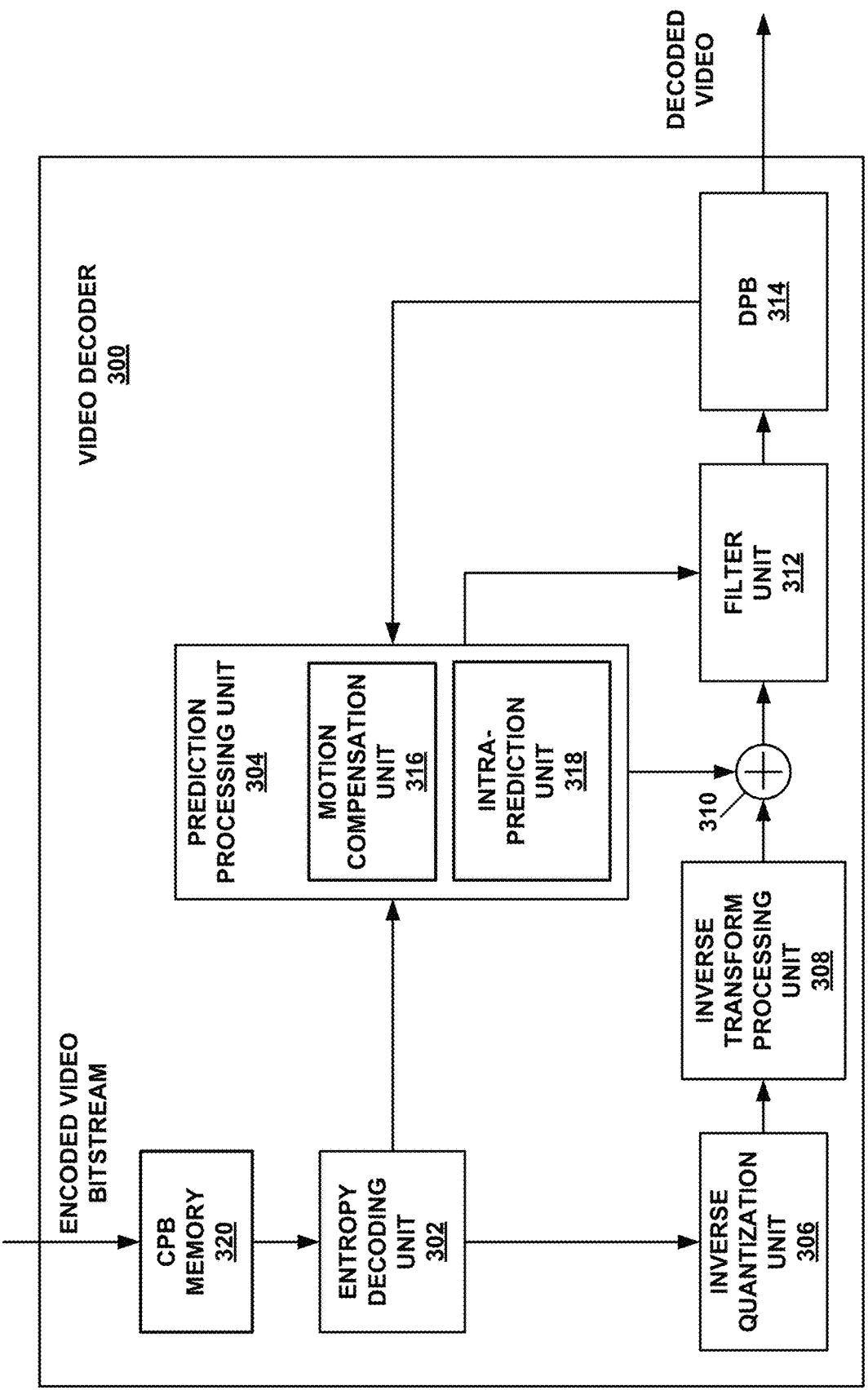
FIG. 8 is a block diagram illustrating an example video decoder that may perform the techniques of this disclosure.

FIG. 8 is a block diagram illustrating an example video decoder 300 that may perform the techniques of this disclosure. FIG. 8 is provided for purposes of explanation and is not limiting on the techniques as broadly exemplified and described in this disclosure. For purposes of explanation, this disclosure describes video decoder 300 is described according to the techniques of JEM and HEVC. However, the techniques of this disclosure may be performed by video coding devices that are configured to other video coding standards.

In the example of FIG. 8, video decoder 300 includes coded picture buffer (CPB) memory 320, entropy decoding unit 302, prediction processing unit 304, inverse quantization unit 306, inverse transform processing unit 308, reconstruction unit 310, filter unit 312, and decoded picture buffer (DPB) 314. Prediction processing unit 304 includes motion compensation unit 316 and intra-prediction unit 318. Prediction processing unit 304 may include addition units to perform prediction in accordance with other prediction modes. As examples, prediction processing unit 304 may include a palette unit, an intra-block copy unit (which may form part of motion compensation unit 318), an affine unit, a linear model (LM) unit, or the like. In other examples, video decoder 300 may include more, fewer, or different functional components.

CPB memory 320 may store video data, such as an encoded video bitstream, to be decoded by the components of video decoder 300. The video data stored in CPB memory 320 may be obtained, for example, from computer-readable medium 110 (FIG. 1). CPB memory 320 may include a CPB that stores encoded video data (e.g., syntax elements) from an encoded video bitstream. Also, CPB memory 320 may store video data other than syntax elements of a coded picture, such as temporary data representing outputs from the various units of video decoder 300. DPB 314 generally stores decoded pictures, which video decoder 300 may output and/or use as reference video data when decoding subsequent data or pictures of the encoded video bitstream. CPB memory 320 and DPB 314 may be formed by any of a variety of memory devices, such as dynamic random access memory (DRAM), including synchronous DRAM (SDRAM), magnetoresistive RAM (MRAM), resistive RAM (RRAM), or other types of memory devices. CPB memory 320 and DPB 314 may be provided by the same memory device or separate memory devices. In various examples, CPB memory 320 may be on-chip with other components of video decoder 300, or off-chip relative to those components.

Additionally, or alternatively, in some examples, video decoder 300 may retrieve coded video data from memory 120 (FIG. 1). That is, memory 120 may store data as discussed above with CPB memory 320. Likewise, memory 120 may store instructions to be executed by video decoder 300, when some or all of the functionality of video decoder 300 is implemented in software to executed by processing circuitry of video decoder 300.

The various units shown in FIG. 8 are illustrated to assist with understanding the operations performed by video decoder 300. The units may be implemented as fixed-function circuits, programmable circuits, or a combination thereof. Similar to FIG. 7, fixed-function circuits refer to circuits that provide particular functionality, and are preset on the operations that can be performed. Programmable circuits refer to circuits that can programmed to perform various tasks, and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, the one or more of the units may be distinct circuit blocks (fixed-function or programmable), and in some examples, the one or more units may be integrated circuits.

Video decoder 300 may include ALUs, EFUs, digital circuits, analog circuits, and/or programmable cores formed from programmable circuits. In examples where the operations of video decoder 300 are performed by software executing on the programmable circuits, on-chip or off-chip memory may store instructions (e.g., object code) of the software that video decoder 300 receives and executes.

Entropy decoding unit 302 may receive encoded video data from the CPB and entropy decode the video data to reproduce syntax elements. Prediction processing unit 304, inverse quantization unit 306, inverse transform processing unit 308, reconstruction unit 310, and filter unit 312 may generate decoded video data based on the syntax elements extracted from the bitstream.

In general, video decoder 300 reconstructs a picture on a block-by-block basis. Video decoder 300 may perform a reconstruction operation on each block individually (where the block currently being reconstructed, i.e., decoded, may be referred to as a "current block").

Entropy decoding unit 302 may entropy decode syntax elements defining quantized transform coefficients of a quantized transform coefficient block, as well as transform information, such as a quantization parameter (QP) and/or transform mode indication(s). Inverse quantization unit 306 may use the QP associated with the quantized transform coefficient block to determine a degree of quantization and, likewise, a degree of inverse quantization for inverse quantization unit 306 to apply. Inverse quantization unit 306 may, for example, perform a bitwise left-shift operation to inverse quantize the quantized transform coefficients. Inverse quantization unit 306 may thereby form a transform coefficient block including transform coefficients.

Inverse quantization unit 306 may use any of the various techniques of this disclosure to perform inverse quantization, e.g., trellis coded inverse quantization using a parity of a partial set of syntax elements, deriving the state machine based on a parity of the number of nonzero coefficients in a neighborhood of coefficient that is being coded, coding a least significant bit of a coefficient right after the significance (gt0) of a coefficient in an interleaved fashion with gt0, removing dependency of the gt1 context on the TCQ state, etc.), as discussed above.

After inverse quantization unit 306 forms the transform coefficient block, inverse transform processing unit 308 may apply one or more inverse transforms to the transform coefficient block to generate a residual block associated with the current block. For example, inverse transform processing unit 308 may apply an inverse DCT, an inverse integer transform, an inverse Karhunen-Loeve transform (KLT), an inverse rotational transform, an inverse directional transform, or another inverse transform to the coefficient block.

Furthermore, prediction processing unit 304 generates a prediction block according to prediction information syntax elements that were entropy decoded by entropy decoding unit 302. For example, if the prediction information syntax elements indicate that the current block is inter-predicted, motion compensation unit 316 may generate the prediction block. In this case, the prediction information syntax elements may indicate a reference picture in DPB 314 from which to retrieve a reference block, as well as a motion vector identifying a location of the reference block in the reference picture relative to the location of the current block in the current picture. Motion compensation unit 316 may generally perform the inter-prediction process in a manner that is substantially similar to that described with respect to motion compensation unit 224 (FIG. 7).

As another example, if the prediction information syntax elements indicate that the current block is intra-predicted, intra-prediction unit 318 may generate the prediction block according to an intra-prediction mode indicated by the prediction information syntax elements. Again, intra-prediction unit 318 may generally perform the intra-prediction process in a manner that is substantially similar to that described with respect to intra-prediction unit 226 (FIG. 7). Intra-prediction unit 318 may retrieve data of neighboring samples to the current block from DPB 314.

Reconstruction unit 310 may reconstruct the current block using the prediction block and the residual block. For example, reconstruction unit 310 may add samples of the residual block to corresponding samples of the prediction block to reconstruct the current block.

Filter unit 312 may perform one or more filter operations on reconstructed blocks. For example, filter unit 312 may perform deblocking operations to reduce blockiness artifacts along edges of the reconstructed blocks. Operations of filter unit 312 are not necessarily performed in all examples.

Video decoder 300 may store the reconstructed blocks in DPB 314. As discussed above, DPB 314 may provide reference information, such as samples of a current picture for intra-prediction and previously decoded pictures for subsequent motion compensation, to prediction processing unit 304. Moreover, video decoder 300 may output decoded pictures from DPB for subsequent presentation on a display device, such as display device 118 of FIG. 1.

Video decoder 300 represents an example of a video decoder configured to determine a first state of a data structure, the first state representing a first quantizer applied to a previously inverse quantized value of a previous transform coefficient of residual data for a block of video data, update the data structure to a second state according to the first state and a parity of a partial set of syntax elements representing a partial set of a plurality of coefficient levels for the previous transform coefficient, determine a second quantizer to be used to inverse quantize a current value of a current transform coefficient according to the second state of the data structure, and inverse quantize the current value of the current transform coefficient using the second quantizer.

Video decoder 300 also represents an example of a video decoder configured to determine a first state of a data structure, the first state representing a first quantizer applied to a previously inverse quantized value of a previous transform coefficient of residual data for a block of video data, update the data structure to a second state according to the first state and a parity of a number of nonzero coefficients in a neighborhood of a current value of a current transform coefficient that is being coded, determine a second quantizer to be used to inverse quantize the current value of the current transform coefficient according to the second state of the data structure, and inverse quantize the current value of the current transform coefficient using the second quantizer.

Video decoder 300 also represents an example of a video decoder configured to code a least significant bit of a previous transform coefficient of residual data for a block of video data, and code, in an interleaved fashion with coding the least significant bit of the previous transform coefficient, a significance of a current transform coefficient that is being coded, wherein coding the significance of the current transform coefficient comprises: determining a first state of a data structure, the first state representing a first quantizer applied to a previously inverse quantized value of a previous transform coefficient of residual data for a block of video data, updating the data structure to a second state according to the first state and a parity based on the least significant bit of the previous transform coefficient, determining a second quantizer to be used to inverse quantize the current value of the current transform coefficient according to the second state of the data structure, and inverse quantize the current value of the current transform coefficient using the second quantizer.

Video decoder 300 also represents an example of a video decoder configured to determine a current context to be used to code a current value of a greater than zero syntax element for a current transform coefficient according to a state of a data structure, code the current value of the greater than zero syntax element using the current context, and code a current value of a greater than one syntax element for the current transform coefficient using a predetermined context that is independent from the state of the data structure.

In some examples, video decoder 300 represents an example of a video decoder configured to determine a first state of a data structure, the first state representing a first quantizer applied to a previously quantized or inverse quantized value of a previous transform coefficient of residual data for a block of video data, update the data structure to a second state according to the first state and whether the previous transform coefficient had an absolute value greater than a threshold, determine a second quantizer to be used to quantize or inverse quantize a current value of a current transform coefficient according to the second state of the data structure, and inverse quantize the current value of the current transform coefficient using the second quantizer.

Video decoder 300 also represents an example of a video decoder configured to determine a first state of a data structure, the first state representing a previous context used to code a previous value of a syntax element for a previous transform coefficient of residual data for a block of video data, update the data structure to a second state according to the first state and whether the previous transform coefficient had an absolute value greater than a threshold, determine a current context to be used to code a current value of the syntax element for a current transform coefficient according to the second state of the data structure, and entropy decode the current value of the syntax element using the current context.

Figure 9:
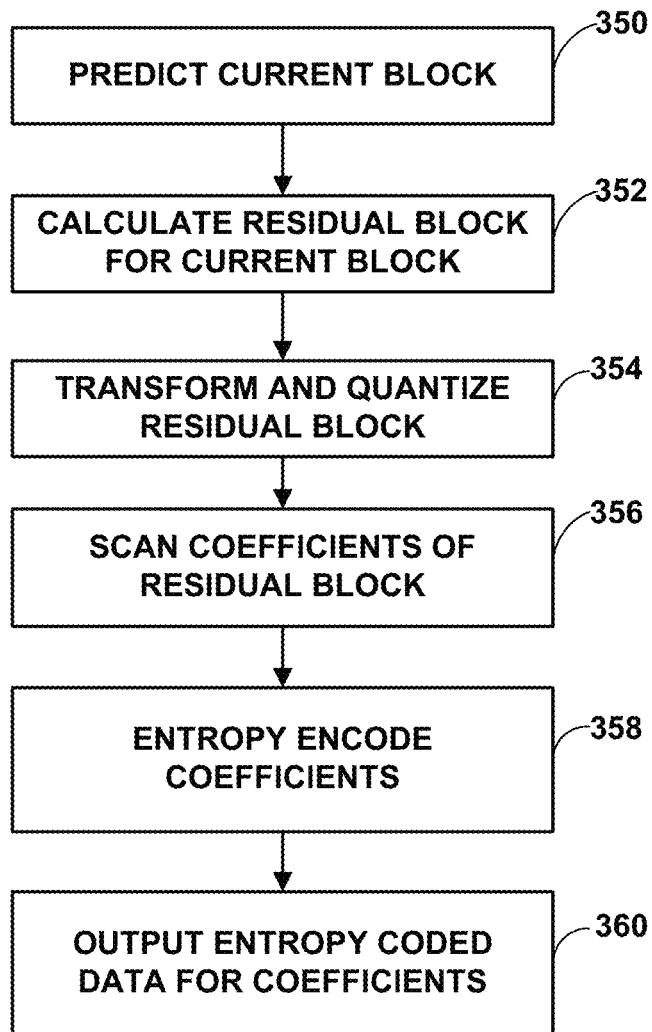
FIG. 9 is a flowchart illustrating an example method for encoding a current block according to the techniques of this disclosure.

FIG. 9 is a flowchart illustrating an example method for encoding a current block according to the techniques of this disclosure. The current block may comprise a current CU. Although described with respect to video encoder 200 (FIGS. 1 and 2), it should be understood that other devices may be configured to perform a method similar to that of FIG. 9.

In this example, video encoder 200 initially predicts the current block (350). For example, video encoder 200 may form a prediction block for the current block. Video encoder 200 may then calculate a residual block for the current block (352). To calculate the residual block, video encoder 200 may calculate a difference between the original, uncoded block and the prediction block for the current block. Video encoder 200 may then transform and quantize coefficients of the residual block (354). In particular, video encoder 200 may use the trellis coded quantization scheme of this disclosure as discussed above to quantize the transform coefficients of the residual block. Next, video encoder 200 may scan the quantized transform coefficients of the residual block (356). During the scan, or following the scan, video encoder 200 may entropy encode the coefficients (358). For example, video encoder 200 may encode the coefficients using CAVLC or CABAC. As discussed above, video encoder 200 may determine a context for encoding values of syntax elements of the coefficients using the trellis coded quantization techniques of this disclosure. Video encoder 200 may then output the entropy coded data of the block (360), including entropy coded data for the coefficients.

In this manner, the method of FIG. 9 represents an example of a method including determining a first state of a data structure, the first state representing a first quantizer applied to a previously quantized value of a previous transform coefficient of residual data for a block of video data, updating the data structure to a second state according to the first state and a parity of a partial set of syntax elements representing a partial set of a plurality of coefficient levels for the previous transform coefficient, determining a second quantizer to be used to quantize a current value of a current transform coefficient according to the second state of the data structure, and quantizing the current value of the current transform coefficient using the second quantizer.

The method of FIG. 9 also represents an example of a method including determining a first state of a data structure, the first state representing a first quantizer applied to a previously quantized value of a previous transform coefficient of residual data for a block of video data, updating the data structure to a second state according to the first state and a parity of a number of nonzero coefficients in a neighborhood of a current value of a current transform coefficient that is being coded, determining a second quantizer to be used to quantize the current value of the current transform coefficient according to the second state of the data structure, and quantizing the current value of the current transform coefficient using the second quantizer.

The method of FIG. 9 also represents an example of a method including coding a least significant bit of a previous transform coefficient of residual data for a block of video data, and coding, in an interleaved fashion with coding the least significant bit of the previous transform coefficient, a significance of a current transform coefficient that is being coded, wherein coding the significance of the current transform coefficient comprises: determining a first state of a data structure, the first state representing a first quantizer applied to a previously quantized value of a previous transform coefficient of residual data for a block of video data, updating the data structure to a second state according to the first state and a parity based on the least significant bit of the previous transform coefficient, determining a second quantizer to be used to quantize the current value of the current transform coefficient according to the second state of the data structure, and quantizing the current value of the current transform coefficient using the second quantizer.

The method of FIG. 9 also represents an example of a method including determining a current context to be used to code a current value of a greater than zero syntax element for a current transform coefficient according to a state of a data structure, coding the current value of the greater than zero syntax element using the current context, and coding a current value of a greater than one syntax element for the current transform coefficient using a predetermined context that is independent from the state of the data structure.

In some examples, the method of FIG. 9 represents an example of a method including determining a first state of a data structure, the first state representing a first quantizer applied to a previously quantized or inverse quantized value of a previous transform coefficient of residual data for a block of video data, updating the data structure to a second state according to the first state and whether the previous transform coefficient had an absolute value greater than a threshold, determining a second quantizer to be used to quantize or inverse quantize a current value of a current transform coefficient according to the second state of the data structure, and quantizing the current value of the current transform coefficient using the second quantizer.

The method of FIG. 9 also represents an example of a method including determining a first state of a data structure, the first state representing a previous context used to code a previous value of a syntax element for a previous transform coefficient of residual data for a block of video data, updating the data structure to a second state according to the first state and whether the previous transform coefficient had an absolute value greater than a threshold, determining a current context to be used to code a current value of the syntax element for a current transform coefficient according to the second state of the data structure, and encoding the current value of the syntax element using the current context.

Figure 10:
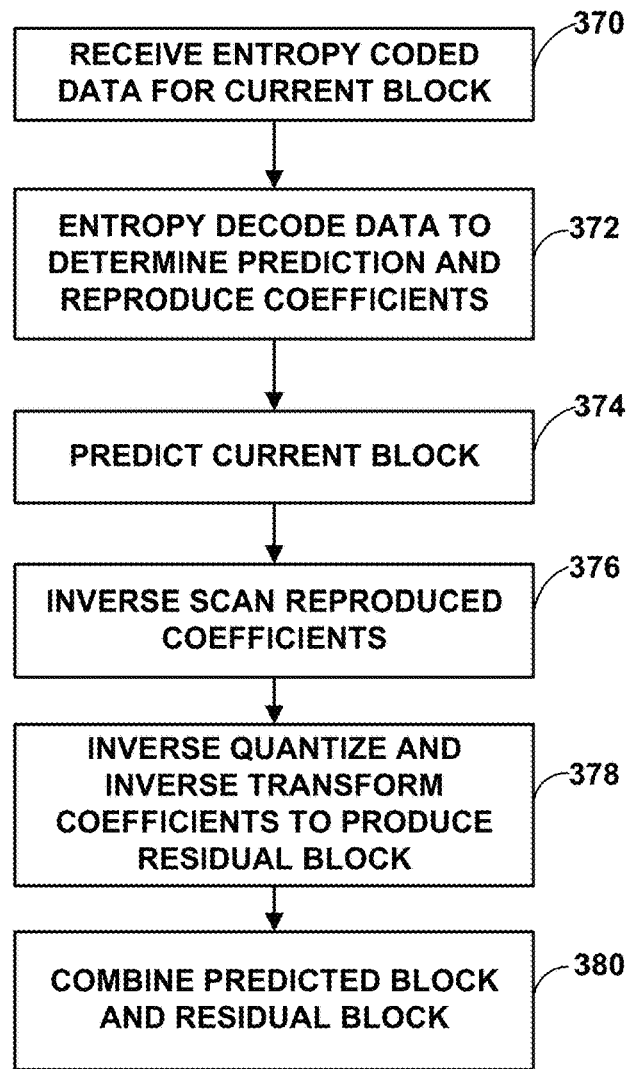
FIG. 10 is a flowchart illustrating an example method for decoding a current block according to the techniques of this disclosure.

FIG. 10 is a flowchart illustrating an example method for decoding a current block of video data according to the techniques of this disclosure. The current block may comprise a current CU. Although described with respect to video decoder 300 (FIGS. 1 and 3), it should be understood that other devices may be configured to perform a method similar to that of FIG. 10.

Video decoder 300 may receive entropy coded data for the current block, such as entropy coded prediction information and entropy coded data for coefficients of a residual block corresponding to the current block (370). Video decoder 300 may entropy decode the entropy coded data to determine prediction information for the current block and to reproduce coefficients of the residual block (372). Video decoder 300 may predict the current block (374), e.g., using an intra- or inter-prediction mode as indicated by the prediction information for the current block, to calculate a prediction block for the current block. Video decoder 300 may then inverse scan the reproduced coefficients (376), to create a block of quantized transform coefficients. Video decoder 300 may then inverse quantize and inverse transform the coefficients to produce a residual block (378). In particular, video decoder 300 may use the trellis coded quantization scheme of this disclosure as discussed above to inverse quantize the quantized transform coefficients of the residual block. Video decoder 300 may ultimately decode the current block by combining the prediction block and the residual block (380).

In this manner, the method of FIG. 10 represents an example of a method including determining a first state of a data structure, the first state representing a first quantizer applied to a previously inverse quantized value of a previous transform coefficient of residual data for a block of video data, updating the data structure to a second state according to the first state and a parity of a partial set of syntax elements representing a partial set of a plurality of coefficient levels for the previous transform coefficient, determining a second quantizer to be used to inverse quantize a current value of a current transform coefficient according to the second state of the data structure, and quantizing the current value of the current transform coefficient using the second quantizer.

In this manner, the method of FIG. 10 represents an example of a method including determining a first state of a data structure, the first state representing a first quantizer applied to a previously inverse quantized value of a previous transform coefficient of residual data for a block of video data, updating the data structure to a second state according to the first state and whether the previous transform coefficient had an absolute value greater than a threshold, determining a second quantizer to be used to inverse quantize a current value of a current transform coefficient according to the second state of the data structure, and inverse quantizing the current value of the current transform coefficient using the second quantizer.

The method of FIG. 10 also represents an example of a method including determining a first state of a data structure, the first state representing a first quantizer applied to a previously inverse quantized value of a previous transform coefficient of residual data for a block of video data, updating the data structure to a second state according to the first state and a parity of a number of nonzero coefficients in a neighborhood of a current value of a current transform coefficient that is being coded, determining a second quantizer to be used to inverse quantize the current value of the current transform coefficient according to the second state of the data structure, and quantizing the current value of the current transform coefficient using the second quantizer.

The method of FIG. 10 also represents an example of a method including coding a least significant bit of a previous transform coefficient of residual data for a block of video data, and coding, in an interleaved fashion with coding the least significant bit of the previous transform coefficient, a significance of a current transform coefficient that is being coded, wherein coding the significance of the current transform coefficient comprises: determining a first state of a data structure, the first state representing a first quantizer applied to a previously inverse quantized value of a previous transform coefficient of residual data for a block of video data, updating the data structure to a second state according to the first state and a parity based on the least significant bit of the previous transform coefficient, determining a second quantizer to be used to inverse quantize the current value of the current transform coefficient according to the second state of the data structure, and quantizing the current value of the current transform coefficient using the second quantizer.

The method of FIG. 10 also represents an example of a method including determining a current context to be used to code a current value of a greater than zero syntax element for a current transform coefficient according to a state of a data structure, coding the current value of the greater than zero syntax element using the current context, and coding a current value of a greater than one syntax element for the current transform coefficient using a predetermined context that is independent from the state of the data structure.

In some examples, the method of FIG. 10 represents an example of a method including determining a first state of a data structure, the first state representing a first quantizer applied to a previously quantized or inverse quantized value of a previous transform coefficient of residual data for a block of video data, updating the data structure to a second state according to the first state and whether the previous transform coefficient had an absolute value greater than a threshold, determining a second quantizer to be used to quantize or inverse quantize a current value of a current transform coefficient according to the second state of the data structure, and inverse quantizing the current value of the current transform coefficient using the second quantizer.

The method of FIG. 10 also represents an example of a method including determining a first state of a data structure, the first state representing a previous context used to code a previous value of a syntax element for a previous transform coefficient of residual data for a block of video data, updating the data structure to a second state according to the first state and whether the previous transform coefficient had an absolute value greater than a threshold, determining a current context to be used to code a current value of the syntax element for a current transform coefficient according to the second state of the data structure, and decoding the current value of the syntax element using the current context.

Figure 11:
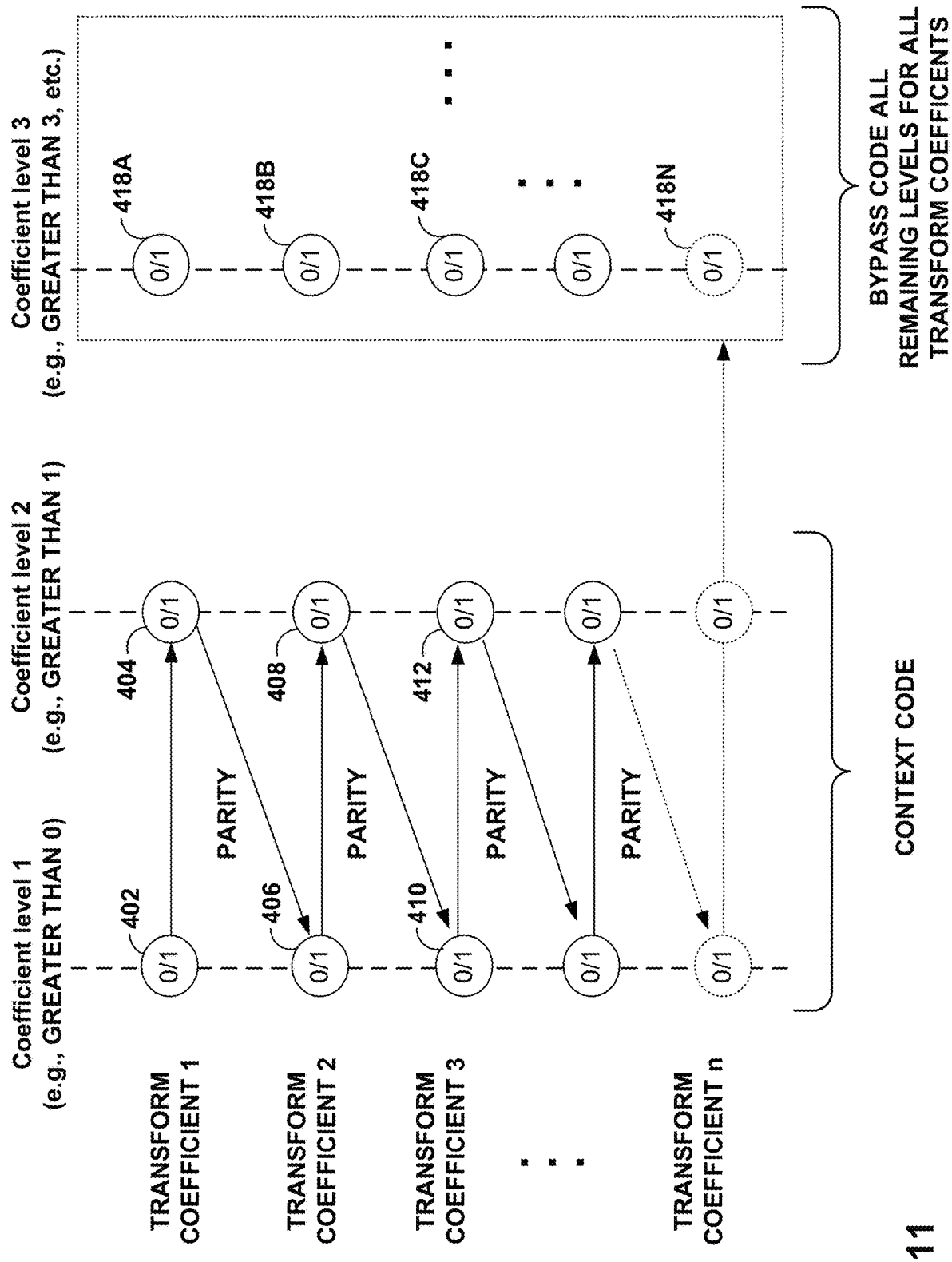
FIG. 11 is a conceptual diagram illustrating an example process for using a parity of a partial set of syntax elements representing a partial set of a plurality of coefficient levels according to the techniques of this disclosure.

FIG. 11 is a conceptual diagram illustrating an example process for using a parity of a partial set of syntax elements representing a partial set of a plurality of coefficient levels according to the techniques of this disclosure. Video encoder 200 and/or video decoder 300 may be configured to use a parity of a partial set of syntax elements to drive a state machine instead of a parity of a full set of syntax elements representing all of the coefficient levels. In the example of FIG. 11, the partial set of syntax elements includes a greater than zero coefficient syntax element ("gt0") and a greater than one coefficient syntax element ("gt1"). In this example, remaining syntax elements includes at least a greater than three coefficient syntax element ("gt3"). However, in other examples, the partial set of syntax elements may include fewer (e.g., only a gt0) or more (e.g., gt3) syntax elements. In some examples, syntax elements may be different. For instance, gt3 may be replaced by a greater than two coefficient syntax element (or simply "gt2").

In example of FIG. 11, video encoder 200 and/or video decoder 300 determines gt0 402 and gt1 404 for a first transform coefficient ("transform coefficient 1"). In some examples, in response to determining a value (e.g., 0) for gt0 402 indicating an absolute value for the first transform coefficient corresponds to (e.g., equals) zero, video encoder 200 and/or video decoder 300 determines a value (e.g., zero) for gt1 404 without encoding or decoding. For instance, video encoder 200 and/or video decoder 300 may skip encoding or decoding gt1 404 in response to determining gt0 402 is 1 (e.g., transform coefficient 1 is zero).

Video encoder 200 and/or video decoder 300 may determine a parity using gt0 402 and gt1 404 for the first transform coefficient of residual data for a block of video data. In some examples, when gt0 indicates an absolute value for the first transform coefficient corresponds to (e.g., equals) zero, video encoder 200 and/or video decoder 300 may set the parity to be equal to gt0 402. For instance, when gt0 indicates 0, video encoder 200 and/or video decoder 300 may set the parity for the first transform coefficient to 0. As such, in this instance, the parity for the first transform coefficient may be '0' when gt0 402 is 0 or when gt0 402 is 1 and gt1 404 is 0 and the parity for the first transform coefficient may be 1 when gt0 402 is 1 and gt1 404 is 1.

Video encoder 200 and/or video decoder 300 determines, using the parity for the first transform coefficient, gt0 406 and gt1 408 for the second transform coefficient ("transform coefficient 2"). For example, video encoder 200 and/or video decoder 300 determines a quantizer to be used to quantize or inverse quantize gt0 406 and gt1 408 using the parity for first transform coefficient. For instance, if the state a state machine has a possible set of states of 0, 1, 2, 3, and the state for transform coefficient 1 is state 0, then video encoder 200 and/or video decoder 300 transitions from state 0 to state 2 when the parity for first transform coefficient is 1 and remains in state 0 when the parity for first transform coefficient is 0 (see FIG. 4). In this instance, video encoder 200 and/or video decoder 300 selects a first quantizer for determining gt0 406 and gt1 408 for the second transform coefficient when the state is 0 and selects a second quantizer for determining gt0 406 and gt1 408 for the second transform coefficient when the state is 2. Video encoder 200 and/or video decoder 300 determines a parity for the second transform coefficient using gt0 406 and gt1 408 and the process repeats to determine gt0 410 and gt1 412 for a third transform coefficient ("transform coefficient 3") using the parity for second transform coefficient, and so on until 'n' number of transform coefficients ("transform coefficient n"). In this way, video encoder 200 and/or video decoder 300 may context code (e.g., context encode or context decode) the partial set of a plurality of coefficient levels for transform coefficients of residual data for the block of video data.

After performing context coding, video encoder 200 and/or video decoder 300 may bypass code (e.g., bypass encode or bypass decode) a set of syntax elements representing remaining levels of the plurality of coefficient levels for transform coefficients of residual data for the block of video data. As shown, the set of syntax elements representing remaining levels of the plurality of coefficient levels may include gt3 418A for the first transform coefficient, gt3 418B for the second transform coefficient, gt3 418C for the third transform coefficient, and so on until gt3 418N for the nth number transform coefficient. Although not shown, the set of syntax elements representing remaining levels of the plurality of coefficient levels for transform coefficients may include any additional levels to allow video encoder 200 and/or video decoder 300 to determine an absolute level for each of the plurality of coefficient levels. In this way, video encoder 200 and/or video decoder 300 may quantize or inverse quantize a set of syntax elements representing the remaining levels (e.g., gt3 418A-418N) of the plurality of coefficient levels for transform coefficients of residual data for the block of video data without grouping all bypass coded bins for simpler parsing, thereby improving a computation efficiency of video encoder 200 and/or video decoder 300.

In some examples, video encoder 200 and/or video decoder 300 may use syntax elements representing one or more bitplane levels encoded or decoded during context coding to determine an absolute level during bypass coding. For example, video encoder 200 and/or video decoder 300 may determine an absolute value for a first transform coefficient using gt0 402, gt1 404, gt3 418A, and a remaining level (not shown). In some examples, video encoder 200 and/or video decoder 300 may determine an absolute value for a transform coefficient using a gt0 plus a gt1 plus a parity plus two times a gt3 plus two times a remaining level. For instance, video encoder 200 and/or video decoder 300 may determine an absolute value of 7 for the first transform coefficient by adding gt0 402 of 1, gt1 404 of 1, a parity of 1, two times gt3 418A of 1 (e.g., 2), two times a remaining level of 1 (e.g., 2).

Figure 12:
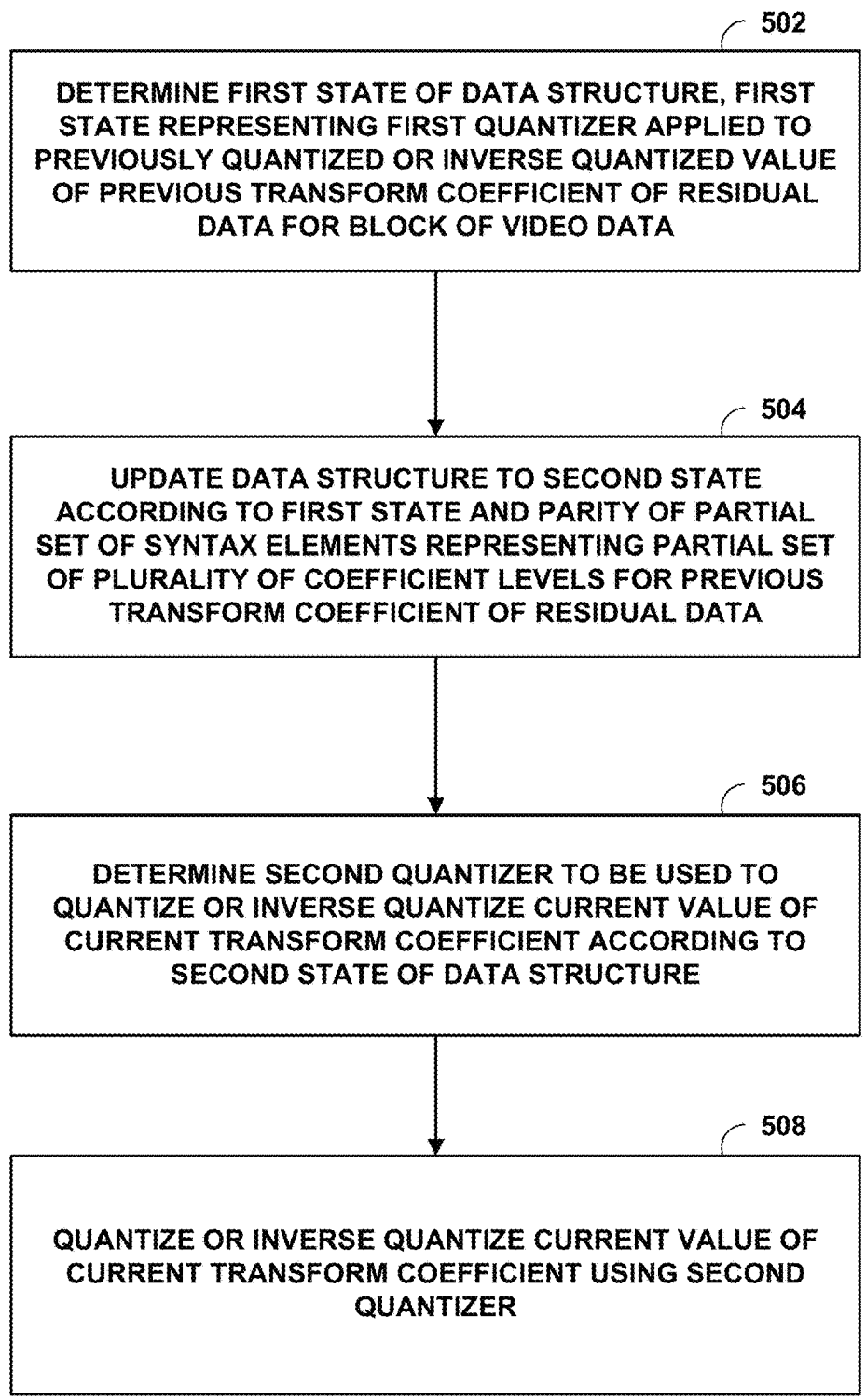
FIG. 12 is a flowchart illustrating an example method for processing video data using a partial set of syntax elements representing a partial set of a plurality of coefficient levels according to the techniques of this disclosure.

FIG. 12 is a flowchart illustrating an example method for processing video data using a partial set of syntax elements representing a partial set of a plurality of coefficient levels according to the techniques of this disclosure. Although described with respect to video encoder 200 (FIGS. 1 and 2), other devices may be configured to perform a method similar to that of FIG. 12. In the example of FIG. 12, video encoder 200 and/or video decoder 300 determine a first state of a data structure, the first state representing a first quantizer applied to a previously quantized or inverse quantized value of a previous transform coefficient of residual data for a block of video data (502). For example, video encoder 200 and/or video decoder 300 determines the first state as a predetermined initial state for an ordinal first transform coefficient of residual data for a block of video data and determines the first state as the previously determined state for all other transform coefficients of the residual data.

Video encoder 200 and/or video decoder 300 update the data structure to a second state according to the first state and a parity of a partial set of syntax elements representing a partial set of a plurality of coefficient levels for the previous transform coefficient (504). For example, video encoder 200 and/or video decoder 300 may determine a parity using a gt0 and a gt1 of a previous the previous transform coefficient of the residual data (see FIG. 11). In this example, video encoder 200 and/or video decoder 300 may determine the second state using, with the parity as an input, the state transition scheme of FIG. 4.

Video encoder 200 and/or video decoder 300 determine a second quantizer to be used to quantize or inverse quantize a current value of a current transform coefficient according to the second state of the data structure (506). For example, video encoder 200 and/or video decoder 300 may determine the second quantizer using the state for the state transition scheme of FIG. 4. Video encoder 200 and/or video decoder 300 quantize or inverse quantize the current value of the current transform coefficient using the second quantizer (508). For example, video encoder 200 quantizes the current value of the current transform coefficient using the second quantizer. In some examples, video decoder 300 inverse quantizes the current value of the current transform coefficient using the second quantizer.

Figure 13:
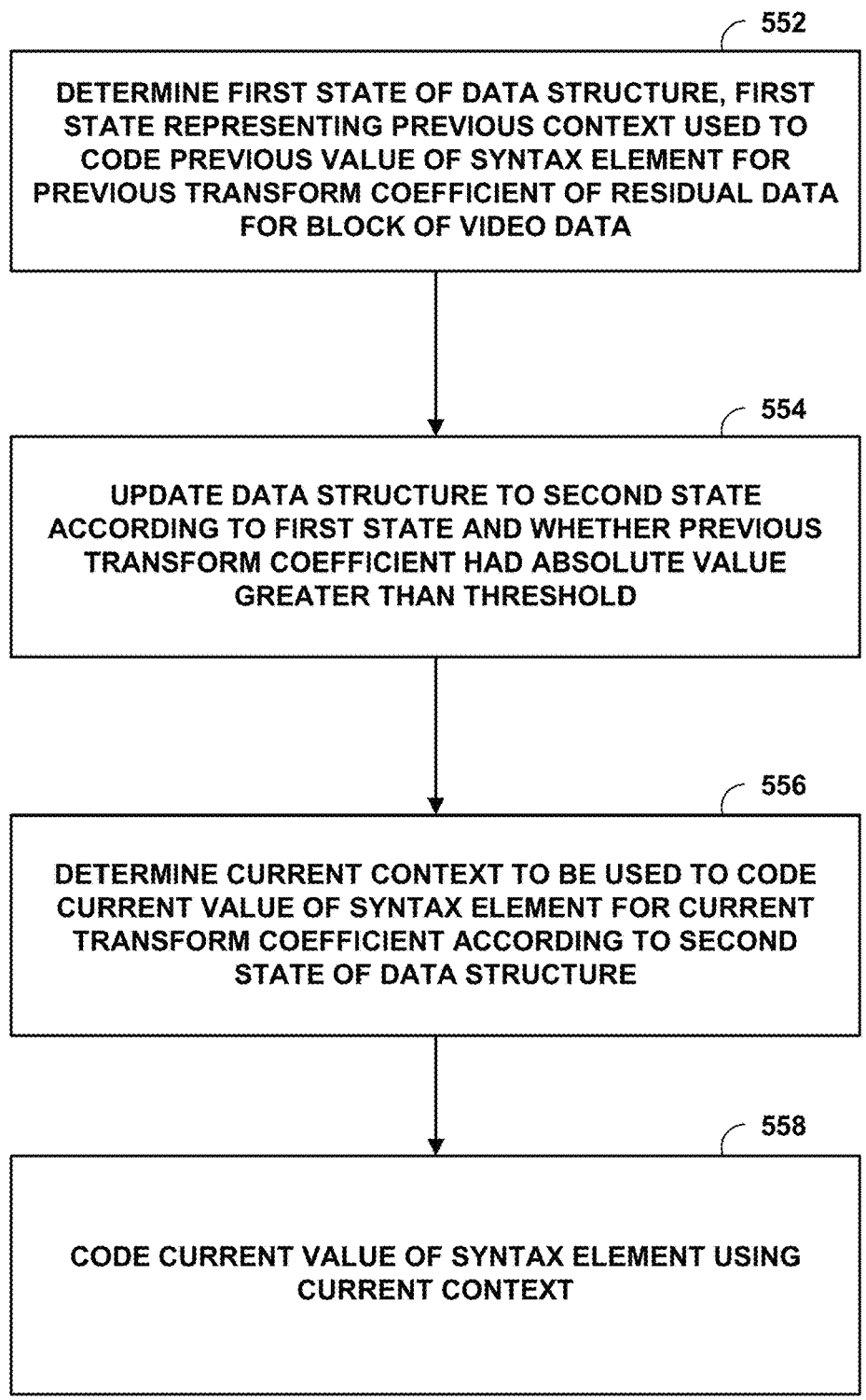
FIG. 13 is a flowchart illustrating an example method for processing video data using context according to the techniques of this disclosure.

FIG. 13 is a flowchart illustrating an example method for processing video data using context according to the techniques of this disclosure. Although described with respect to video encoder 200 (FIGS. 1 and 2), other devices may be configured to perform a method similar to that of FIG. 13. In the example of FIG. 13, video encoder 200 and/or video decoder 300 determine a first state of a data structure, the first state representing a previous context used to code a previous value of a syntax element for a previous transform coefficient of residual data for a block of video data (552). Video encoder 200 and/or video decoder 300 update the data structure to a second state according to the first state and whether the previous transform coefficient had an absolute value greater than a threshold (554). For example, video encoder 200 and/or video decoder 300 update the data structure (e.g., of FIG. 6) to a second state according to the first state and whether the previous transform coefficient had an absolute value greater than zero (e.g., gt0), greater than one (e.g., gt1), greater than two (e.g., gt2), greater than three (gt3), or another bitplane level.

Video encoder 200 and/or video decoder 300 determine a current context to be used to code a current value of the syntax element for a current transform coefficient according to the second state of the data structure (556). Video encoder 200 and/or video decoder 300 code the current value of the syntax element using the current context (558). For example, video encoder 200 encodes the current value of the syntax element using the current context. In some examples, video decoder 300 decodes the current value of the syntax element using the current context.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of quantizing or inverse quantizing for processing video data, the method comprising:
coding a value for a first greater than zero syntax element for a first quantized transform coefficient of a residual block of video data;
after coding the value for the first greater than zero syntax element, coding a first parity bit representing a parity for the first quantized transform coefficient;
after coding the first parity bit, coding one or more values for one or more syntax elements representing a remaining level value for the first quantized transform coefficient;
determining a first state of a data structure, the first state representing a first quantizer applied when quantizing or inverse quantizing the first quantized transform coefficient;
updating the data structure to a second state according to the first state and the parity for the first quantized transform coefficient;
after coding the value for the first greater than zero syntax element and the first parity bit, coding a value for a second greater than zero syntax element for a second quantized transform coefficient of the residual block of video data;
after coding the value for the second greater than zero syntax element, coding a second parity bit representing a parity for the second quantized transform coefficient;
after coding the second parity bit, coding one or more values for one or more syntax elements representing a remaining level value for the second quantized transform coefficient;
determining a second quantizer to be applied when quantizing or inverse quantizing the second quantized transform coefficient according to the second state of the data structure; and
quantizing or inverse quantizing the second quantized transform coefficient using the second quantizer.

2. The method of claim 1, further comprising:
determining the parity for the first quantized transform coefficient from the first parity bit after coding the first greater than zero syntax element for the first quantized transform coefficient and before coding a full set of syntax elements representing an entire level for the first quantized transform coefficient, the full set of syntax elements including the one or more values for one or more syntax elements representing the remaining level value for the first quantized transform coefficient; and
determining the parity for the second quantized transform coefficient from the second parity bit after coding the second greater than zero syntax element for the second quantized transform coefficient and before coding a full set of syntax elements representing an entire level for the second quantized transform coefficient, the full set of syntax elements including the one or more values for the one or more syntax elements representing the remaining level value for the second quantized transform coefficient.

3. The method of claim 2, further comprising:
after determining the second quantizer, coding the full set of syntax elements representing the entire level for the first quantized transform coefficient.

4. The method of claim 3, wherein a first set of syntax elements for the first quantized transform coefficient includes the first greater than zero syntax element and the first parity bit, the method further comprising:
    after coding the first set of syntax elements, coding a second set of syntax elements for the first quantized transform coefficient, the second set of syntax elements representing a certain partially coded level for the first quantized transform coefficient that is less than a full set of syntax elements representing the entire level for the first quantized transform coefficient.

5. The method of claim 4, further comprising, after coding the second set of syntax elements:
    bypass encoding or bypass decoding a first set of syntax elements representing a remaining level for the first quantized transform coefficient and a second set of syntax elements representing a remaining level for the second quantized transform coefficient.

6. The method of claim 1, further comprising:
    forming a prediction block for the block;
    calculating a residual block for the block, the residual block representing pixel by pixel differences between the block and the prediction block; and
    transforming the residual block to produce the previous transform coefficient and the current transform coefficient,
    wherein quantizing or inverse quantizing comprises quantizing a transform coefficient to form the second quantized transform coefficient.

7. The method of claim 1, wherein quantizing or inverse quantizing comprises inverse quantizing the second quantized transform coefficient to form a second transform coefficient, the method further comprising:
    inverse quantizing the first quantized transform coefficient to form a first transform coefficient;
    forming a prediction block for the block;
    inverse transforming a transform block including the first transform coefficient and the second transform coefficient to produce a residual block for the block; and
    combining the prediction block and the residual block to reconstruct the block.

8. The method of claim 1, wherein the data structure comprises a state machine.

9. The method of claim 8, wherein the state machine has a possible set of states of 0, 1, 2, 3, and has transitions from:
    state 0 to state 0, state 1 to state 2, state 2 to state 1, and state 3 to state 3 when the parity equals 0; and
    state 0 to state 2, state 1 to state 0, state 2 to state 3, and state 3 to state 1 when the parity equals 1.

10. The method of claim 9, wherein determining the second quantizer comprises:
    determining a quantizer Q0 when the second state comprises state 0 or state 1; or
    determining a quantizer Q1 when the second state comprises state 2 or state 3.

11. A device for quantizing or inverse quantizing for processing video data, the device comprising processing circuitry configured to:
    code a value for a first greater than zero syntax element for a first quantized transform coefficient of a residual block of video data;
    after coding the value for the first greater than zero syntax element, code a first parity bit representing a parity for the first quantized transform coefficient;
    after coding the first parity bit, code one or more values for one or more syntax elements representing a remaining level value for the first quantized transform coefficient;
    determine a first state of a data structure, the first state representing a first quantizer applied when quantizing or inverse quantizing the first quantized transform coefficient;
    update the data structure to a second state according to the first state and the parity for the first quantized transform coefficient;
    after coding the value for the first greater than zero syntax element and the first parity bit, code a value for a second greater than zero syntax element for a second quantized transform coefficient of the residual block of video data;
    after coding the value for the second greater than zero syntax element, code a second parity bit representing a parity for the second quantized transform coefficient;
    after coding the second parity bit, code one or more values for one or more syntax elements representing a remaining level value for the second quantized transform coefficient;
    determine a second quantizer to be applied when quantizing or inverse quantizing the second quantized transform coefficient according to the second state of the data structure; and
    quantize or inverse quantize the second quantized transform coefficient using the second quantizer.

12. The device of claim 11, wherein the processing circuitry is configured to:
    determine the parity for the first quantized transform coefficient from the first parity bit after coding the first greater than zero syntax element for the first quantized transform coefficient and before coding a full set of syntax elements representing an entire level for the first quantized transform coefficient, the full set of syntax elements including the one or more values for the one or more syntax elements representing the remaining level value for the first quantized transform coefficient; and
    determine the parity for the second quantized transform coefficient from the second parity bit after coding the second greater than zero syntax element for the second quantized transform coefficient and before coding the one or more values for the one or more syntax elements representing the remaining level value for the second quantized transform coefficient.

13. The device of claim 12, wherein the processing circuitry is configured to:
    after determining the second quantizer, code the full set of syntax elements representing the entire level for the first quantized transform coefficient.

14. The device of claim 13, wherein a first set of syntax elements for the first quantized transform coefficient includes the first greater than zero syntax element and the first parity bit, and wherein the processing circuitry is configured to:
    after coding the first set of syntax elements, code a second set of syntax elements for the first quantized transform coefficient, the second set of syntax elements representing a certain partially coded level for the first quantized transform coefficient that is less than a full set of syntax elements representing the entire level for the first quantized transform coefficient.

15. The device of claim 14, wherein the processing circuitry is configured to, after coding the second set of syntax elements:
bypass code or bypass decode a set of syntax elements representing a remaining level for the first quantized transform coefficient and a second set of syntax elements representing a remaining level for the second quantized transform coefficient.

16. The device of claim 11, wherein the processing circuitry is configured to:
form a prediction block for the block;
calculate a residual block for the block, the residual block representing pixel by pixel differences between the block and the prediction block; and
transform the residual block to produce the previous transform coefficient and the current transform coefficient,
wherein, to quantize or inverse quantize, the processing circuitry is configured to quantize a transform coefficient to form the second quantized transform coefficient.

17. The device of claim 11, wherein the processing circuitry is configured to:
form a prediction block for the block;
inverse transform a transform block including the previous transform coefficient and the current transform coefficient to produce a residual block for the block; and
combine the prediction block and the residual block to reconstruct the block,
wherein, to quantize or inverse quantize, the processing circuitry is configured to inverse quantize.

18. The device of claim 11, wherein the data structure comprises a state machine.

19. The device of claim 11, wherein the state machine has a possible set of states of 0, 1, 2, 3, and has transitions from:
state 0 to state 0, state 1 to state 2, state 2 to state 1, and state 3 to state 3 when the parity equals 0; and
state 0 to state 2, state 1 to state 0, state 2 to state 3, and state 3 to state 1 when the parity equals 1.

20. The device of claim 19, wherein, to determine the second quantizer, the processing circuitry is configured to:
determine a quantizer Q0 when the second state comprises state 0 or state 1; or
determine a quantizer Q1 when the second state comprises state 2 or state 3.

21. The device of claim 11, further comprising a camera configured to capture the video data.

22. The device of claim 11, further comprising a display configured to display decoded video data.

23. The device of claim 11, wherein the device comprises one or more of a camera, a computer, a mobile device, a broadcast receiver device, or a set-top box.

24. The device of claim 11, further comprising a memory configured to store the video data.

25. The device of claim 11, wherein the device comprises at least one of:
an integrated circuit;
a microprocessor; or
a wireless communication device.

26. A device for quantizing or inverse quantizing for processing video data, the device comprising:
means for coding a value for a first greater than zero syntax element for a first quantized transform coefficient of a residual block of video data;
means for coding a first parity bit representing a parity for the first quantized transform coefficient after coding the value for the first greater than zero syntax element;
means for coding one or more values for one or more syntax elements representing a remaining level value for the first quantized transform coefficient after coding the first parity bit;
means determining a first state of a data structure, the first state representing a first quantizer applied when quantizing or inverse quantizing the first quantized transform coefficient;
means for coding a value for a second greater than zero syntax element for a second quantized transform coefficient of the residual block of video data after coding the value for the first greater than zero syntax element and the first parity bit;
means for coding a second parity bit representing a parity for the second quantized transform coefficient after coding the value for the second greater than zero syntax element;
means for coding one or more values for one or more syntax elements representing a remaining level value for the second quantized transform coefficient after coding the second parity bit;
means for updating the data structure to a second state according to the first state and the parity for the first quantized transform coefficient;
means for determining a second quantizer to be applied when quantizing or inverse quantizing the second quantized transform coefficient according to the second state of the data structure; and
means for quantizing or inverse quantizing the second quantized transform coefficient using the second quantizer.

27. A computer-readable storage medium having stored thereon instructions that, when executed, cause a processor to:
code a value for a first greater than zero syntax element for a first quantized transform coefficient of a residual block of video data;
after coding the value for the first greater than zero syntax element, code a first parity bit representing a parity for the first quantized transform coefficient;
after coding the first parity bit, code one or more values for one or more syntax elements representing a remaining level value for the first quantized transform coefficient;
determine a first state of a data structure, the first state representing a first quantizer applied when quantizing or inverse quantizing the first quantized transform coefficient;
update the data structure to a second state according to the first state and the parity for the first quantized transform coefficient;
after coding the value for the first greater than zero syntax element and the first parity bit, code a value for a second greater than zero syntax element for a second quantized transform coefficient of the residual block of video data;
after coding the value for the second greater than zero syntax element, code a second parity bit representing a parity for the second quantized transform coefficient;
after coding the second parity bit, code one or more values for one or more syntax elements representing a remaining level value for the second quantized transform coefficient;

determine a second quantizer to be applied when quantizing or inverse quantizing the second quantized transform coefficient according to the second state of the data structure; and quantize or inverse quantize the second quantized transform coefficient using the second quantizer.

\* \* \* \* \*